(12) United States Patent  
Heyl

(10) Patent No.: US 7,705,267 B2  
(45) Date of Patent: Apr. 27, 2010

(54) SEMICONDUCTOR FAILURE ANALYSIS TOOL

(76) Inventor: Jon Heyl, 3116 Crystal Creek Dr., Orlando, FL (US) 32837

( * ) Notice: Subject to any disclaimer, the term of this patent is extended or adjusted under 35 U.S.C. 154(b) by 922 days.

(21) Appl. No.: 11/480,299

(22) Filed: Jun. 30, 2006

(65) Prior Publication Data

US 2007/0075050 A1   Apr. 5, 2007

Related U.S. Application Data

(60) Provisional application No. 60/695,477, filed on Jun. 30, 2005.

(51) Int. Cl.
*B23K 26/38* (2006.01)

(52) U.S. Cl. .................... 219/121.68; 219/121.69; 378/62; 438/4

(58) Field of Classification Search ............ 219/121.67, 219/121.68, 121.69, 121.7, 121.71, 121.72, 219/121.61, 121.62, 121.83; 348/135, 136; 378/62, 63, 98.3; 73/606, 607, 608; 438/4, 438/15, 16

See application file for complete search history.

(56) References Cited

U.S. PATENT DOCUMENTS

| 5,491,319 | A |   | 2/1996 | Economikos et al. |
| 5,549,003 | A | * | 8/1996 | Drescher-Krasicka ........ 73/606 |

(Continued)

FOREIGN PATENT DOCUMENTS

| EP | 544398 A1 | * | 6/1993 |
| JP | 54-158984 A | * | 12/1979 |

OTHER PUBLICATIONS

Dubotzky, B. Kruger, "Evaluation of Alternative Preparation Methods for Failure Analysis at Modern Chip and Package Technologies";
27th International Symposium for Testing and Failure Analysis, Session 3: Packaging; Nov. 2001; 8386, (2001).

(Continued)

*Primary Examiner*—Geoffrey S Evans  
(74) *Attorney, Agent, or Firm*—Daniel Law Offices, P.A.; Jason T. Daniel, Esq.

(57) ABSTRACT

Systems and methods for removing material from a packaged electronic device of the type encapsulated with a protective material that forms an outer surface of the device. An exemplary system includes a stage for placing the device in a first position for receiving laser radiation to remove the material by ablation, and for placing the device in a second position for viewing one or more features along the outer surface of the device. An optical system is configured to provide an exterior image, including one or more features along an exposed surface of the device, while the device remains in the second position. A viewing system displays a captured image of the device, including one or more features interior to the protective surface, overlayed with the exterior image for simultaneous viewing of both images so that a position of a first feature present in the captured image can be viewed in relation to a position of a second feature in the exterior image. The combination of the first feature position and the second feature position can be used to define a region of the device for material removal with a laser. In an associated method a captured image of the device is provided, the image including one or more features interior to the protective surface. One or more features along the outer surface of the device are viewed with an optical system while the device remains on a stage, the optical system providing an exterior image. The captured image is combined with the exterior image for simultaneous viewing so that the position of a first feature present in the captured image can be viewed in relation to the position of a second feature in the exterior image. A region is defined for decapsulation based on the position of the first feature relative to the position of the second feature.

29 Claims, 14 Drawing Sheets

U.S. PATENT DOCUMENTS

| | | | |
|---|---|---|---|
| 5,611,946 A | | 3/1997 | Leong et al. |
| 6,089,095 A * | | 7/2000 | Yang et al. .................... 73/606 |
| 6,227,704 B1 * | | 5/2001 | Bani-Hashemi et al. ....... 378/63 |
| 6,335,208 B1 * | | 1/2002 | Lowry ........................... 438/4 |
| 6,579,376 B1 * | | 6/2003 | Ikkai et al. .................... 134/1 |
| 6,797,919 B1 | | 9/2004 | Millard et al. |
| 6,917,011 B2 * | | 7/2005 | Hong et al. ............ 219/121.69 |
| 7,125,729 B2 * | | 10/2006 | Burger et al. .................. 438/4 |
| 7,271,012 B2 | | 9/2007 | Anderson |
| 7,369,644 B2 * | | 5/2008 | Kim et al. ..................... 378/63 |
| 2003/0052099 A1 * | | 3/2003 | Lipman et al. ......... 219/121.68 |
| 2004/0247076 A1 * | | 12/2004 | Navab et al. .................. 378/63 |

OTHER PUBLICATIONS

M. Frazier, S.A. Mathews, M. T. Duignan, L. D. Skoglund, Z. Wang, R. C. Dias; "Laser-Based Sample Preparation for Electronic Package Failure Analysis"; *Proceedings of SPIE vol. #4637: Photon Processing in Microelectronics and Photonics,* Jan. 2002, 4637, 374-377 (2002).

M. H. Hong, Z. H. Mai, G. X. Chen, T. Thiam, W. D. Song, Y. F. Lu, C. E. Soh, T. C. Chong; "Pulsed Laser Ablation of IC Packages for Device Failure Analysis"; *Proceedings of SPIE vol. #4637: Photon Processing in Microelectronics and Photonics,* Jan. 2002; 4637, 44-452 (2002).

I. Itzkan, D. Albagli, M. Dark, L. T. Peleman, C. Von Rosenberg, M. S. Feld; "Short Pulse Laser Ablation is Photomechanical, not Thermal or Chemical"; *Conference Proceedings, IEEE Laser and Electro-Optics Society, 1994 7th annual Meeting;* IEEE, New York, NY, USA; vol. 2; 71-72 (1994).

Yacov Domankevitz, Norman S. Nishioka; "Measurement of Laser Ablation Threshold with a High Speed Framing Camera"; *IEEE Journal of Quantum Electronics;* vol. 26, No. 12; 22762278 (1990).

A. A. Kolomenskii, P. Hess; "UV Laser Excitation of Broadband Surface Acoustic Wave Pulses in Silicon Near the Ablation Threshold"; *1994 IEEE Ultrasonics Symposium Proceedings,* IEEE, New York, NY, USA; vol. 21, 651-654 (1994).

George Carter, "Laser Decapsulation of Transfer Molded Plastic Packages for Failure Analysis" *ISTFA 2002,* Santa Clara, CA (2002).

* cited by examiner

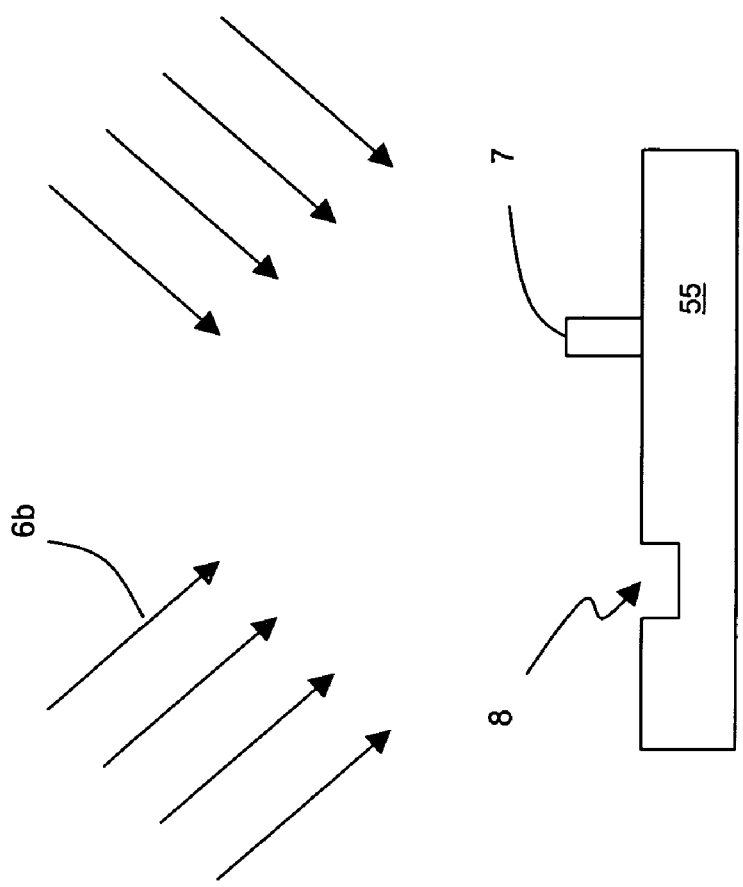
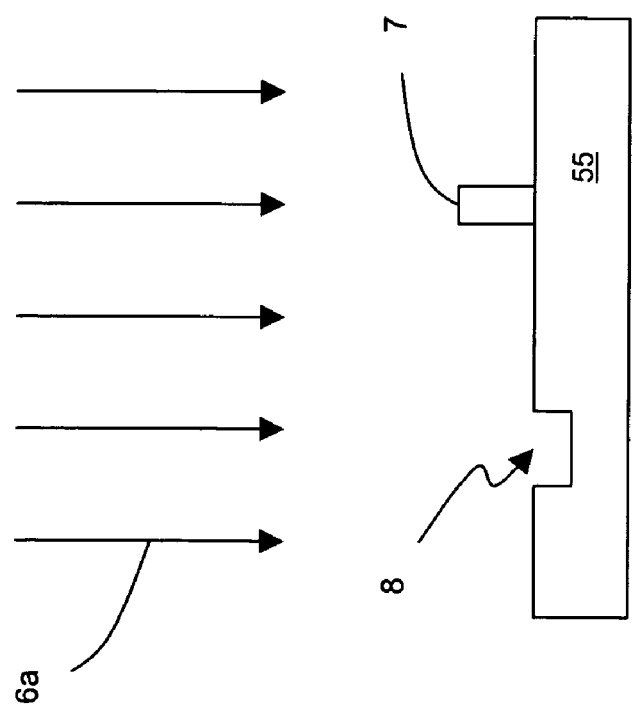
FIG. 4A
FIG. 4B

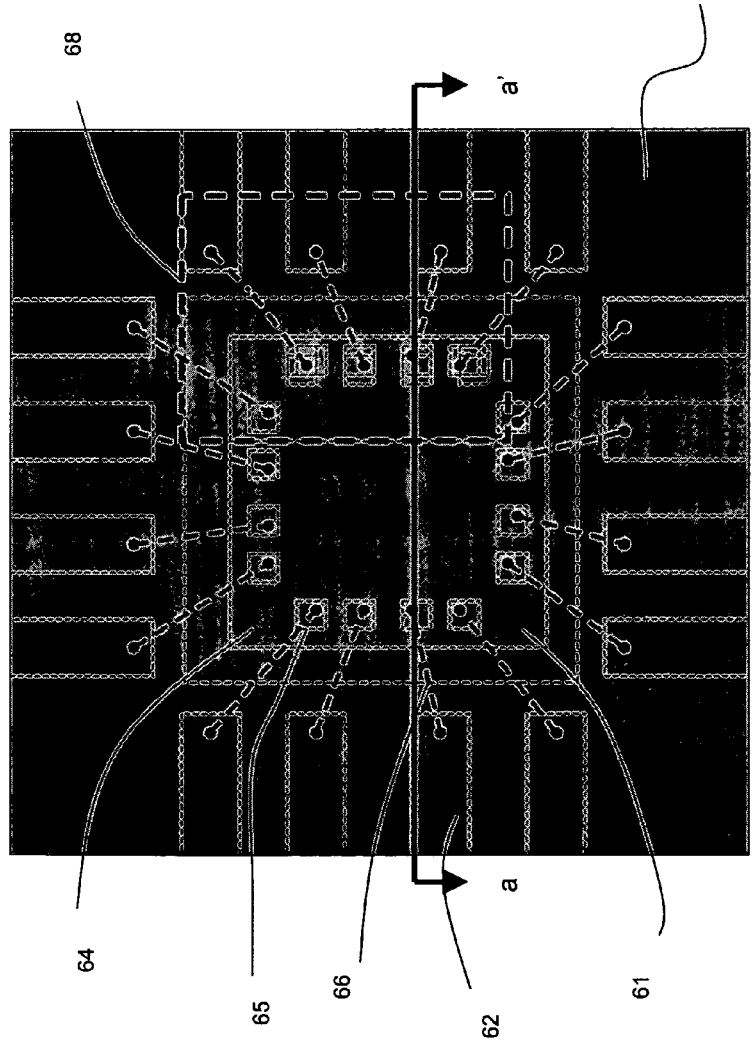
FIG. 6A-a
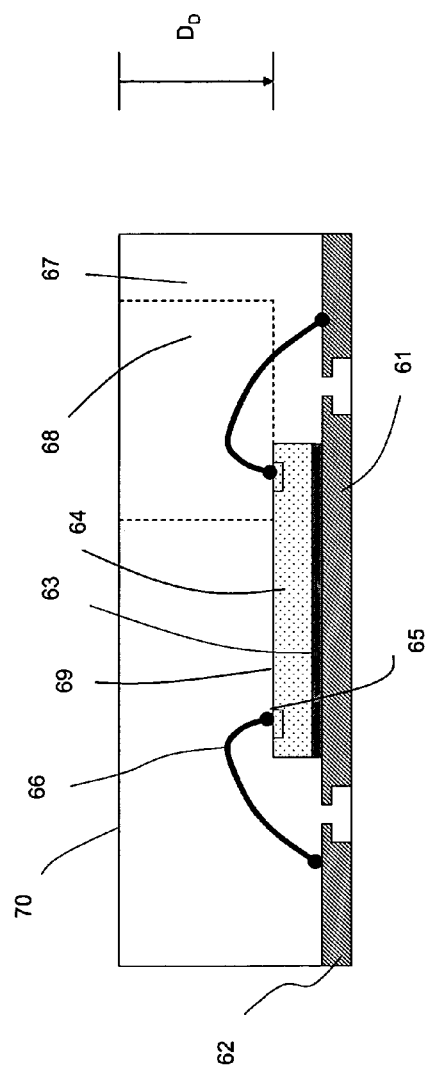
FIG. 6A-b

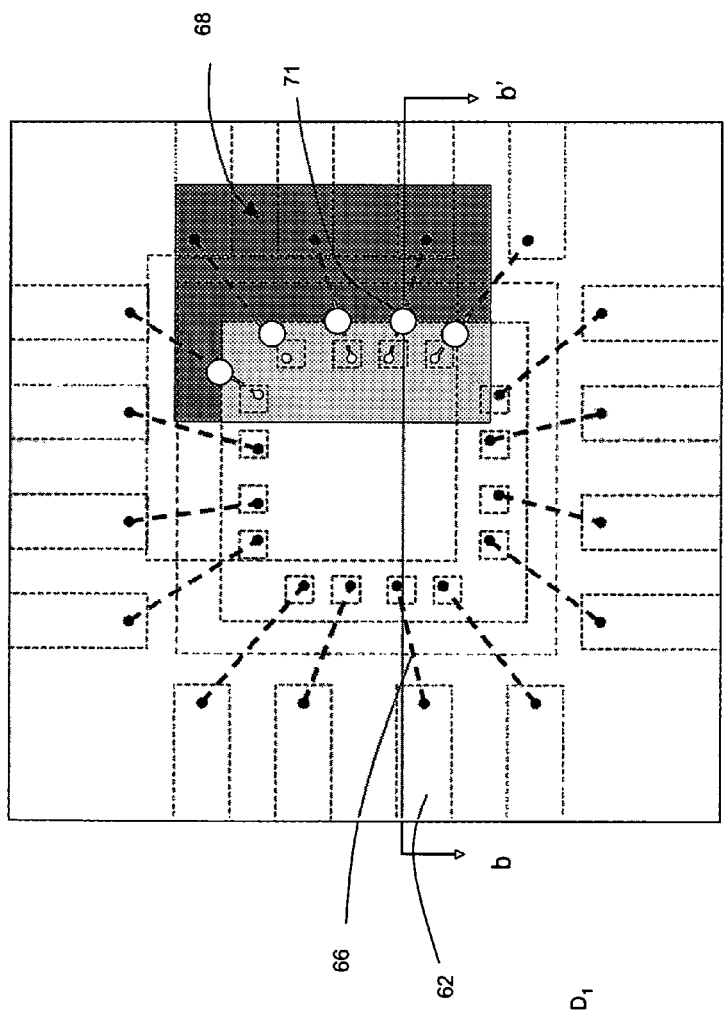
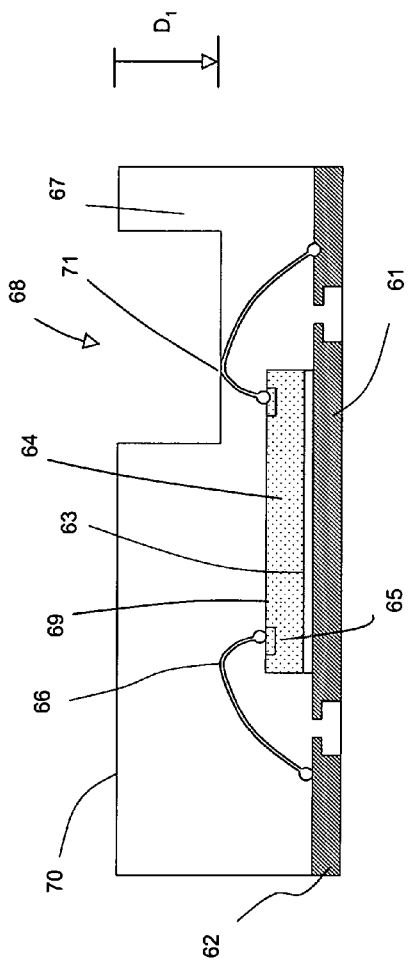
FIG. 6B-a
FIG. 6B-b

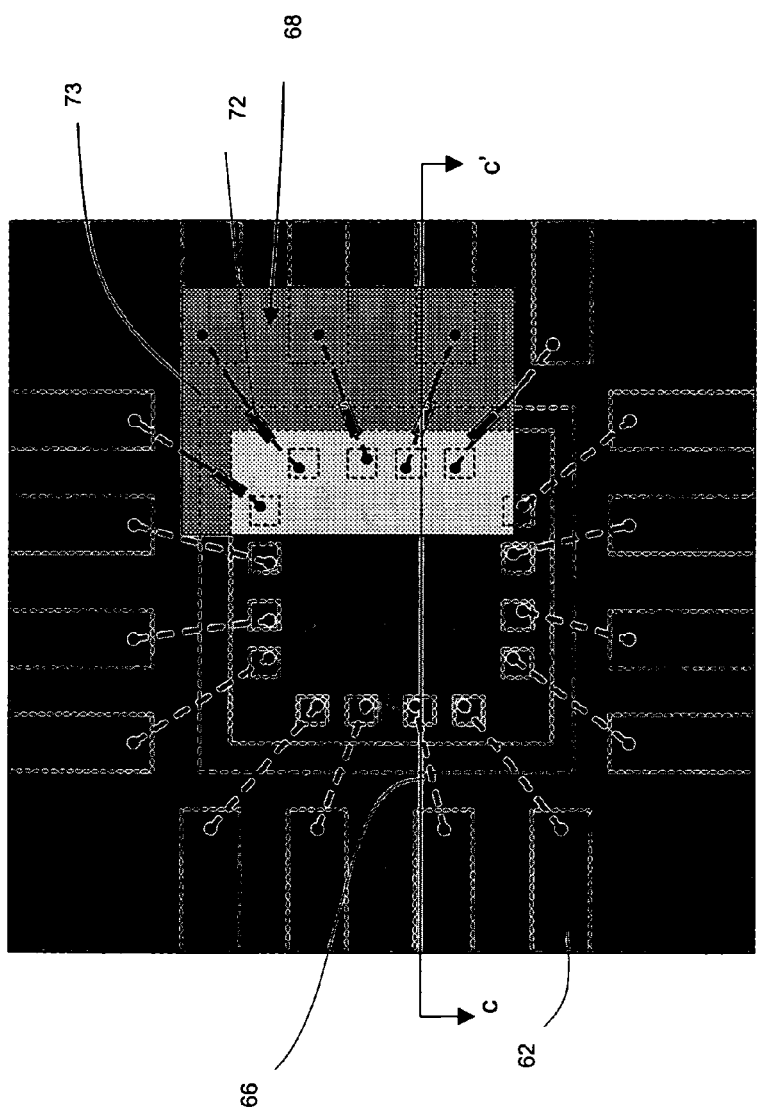
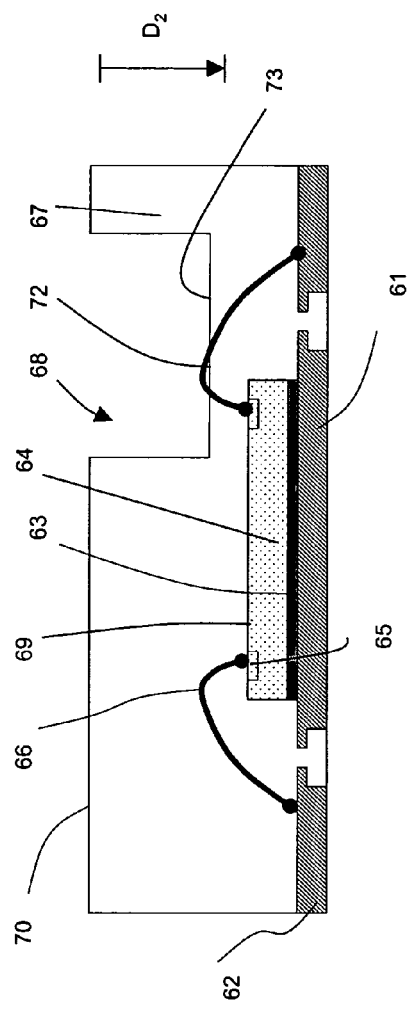
FIG. 6C-a
FIG. 6C-b

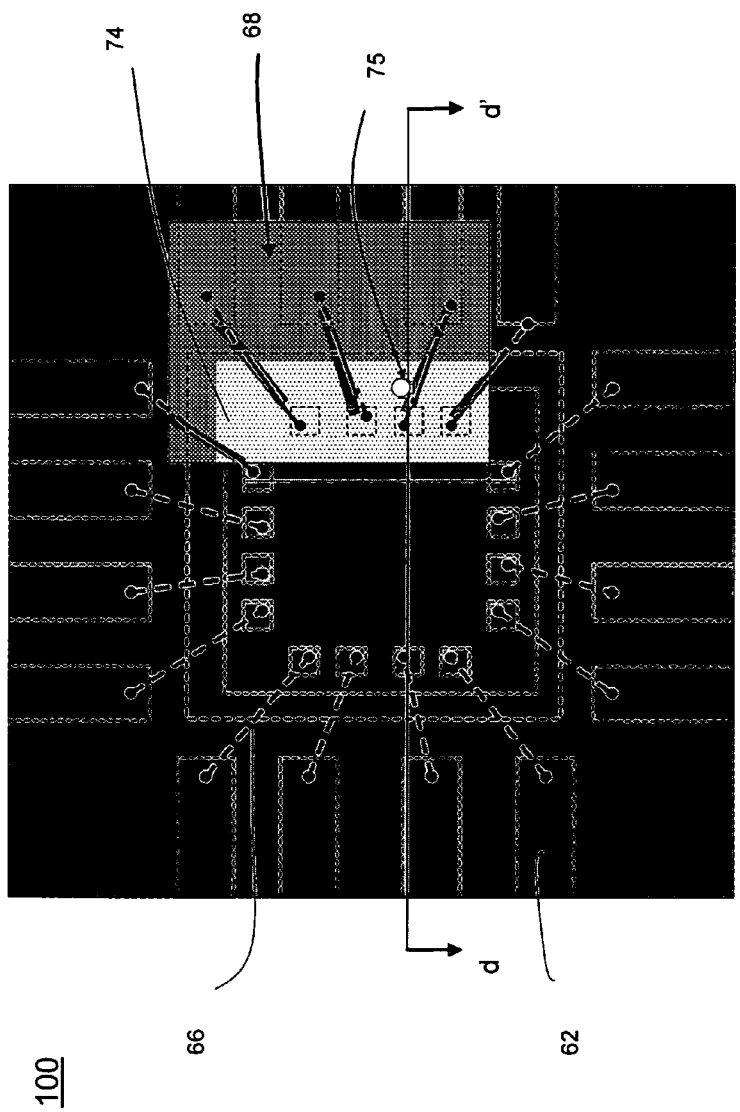
FIG. 6D-a
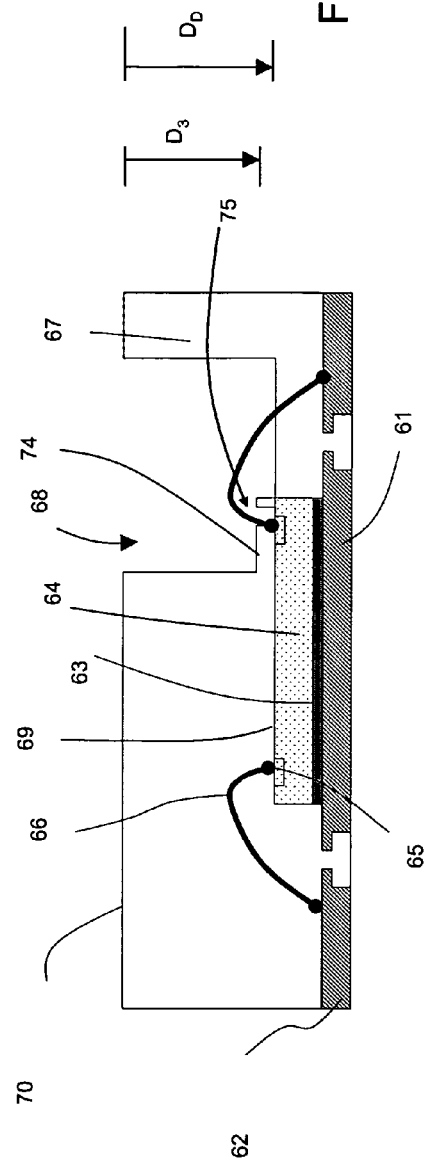
FIG. 6D-b

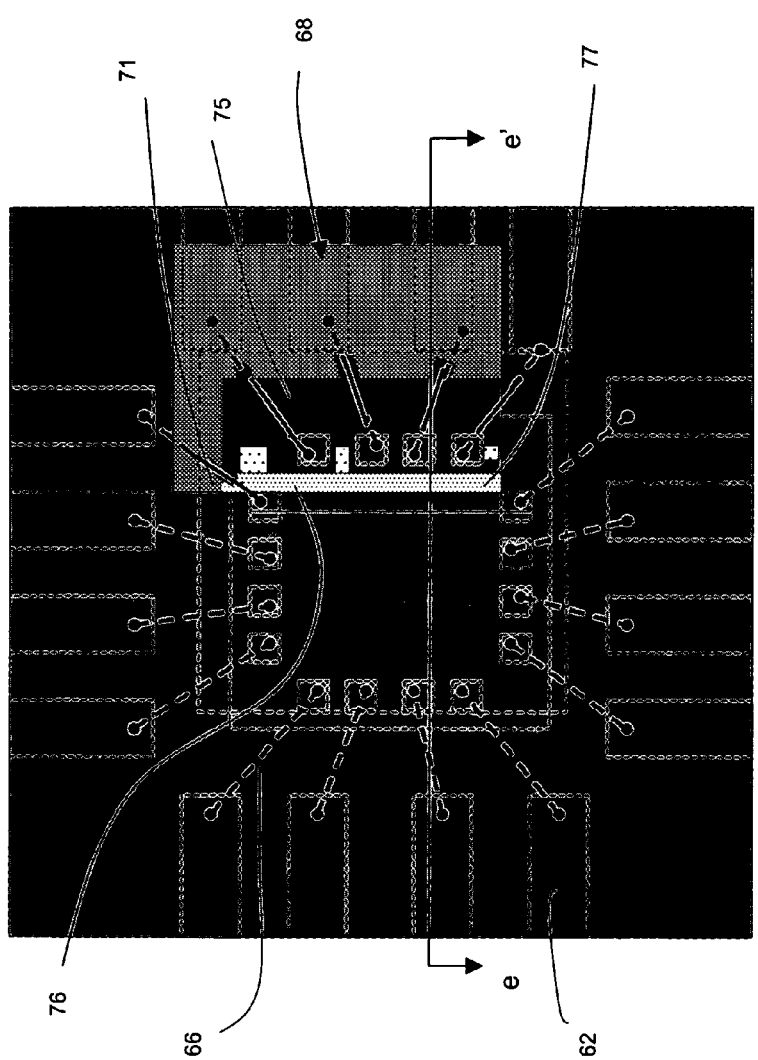
FIG. 6E-a
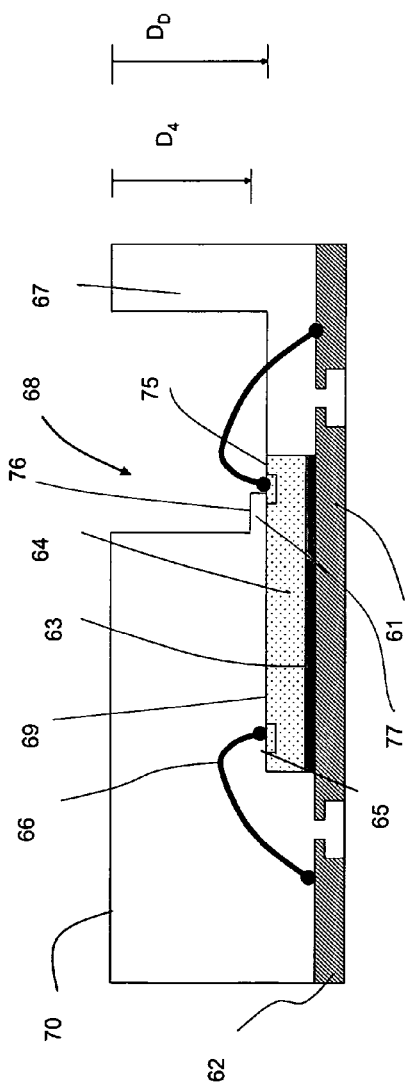
FIG. 6E-b

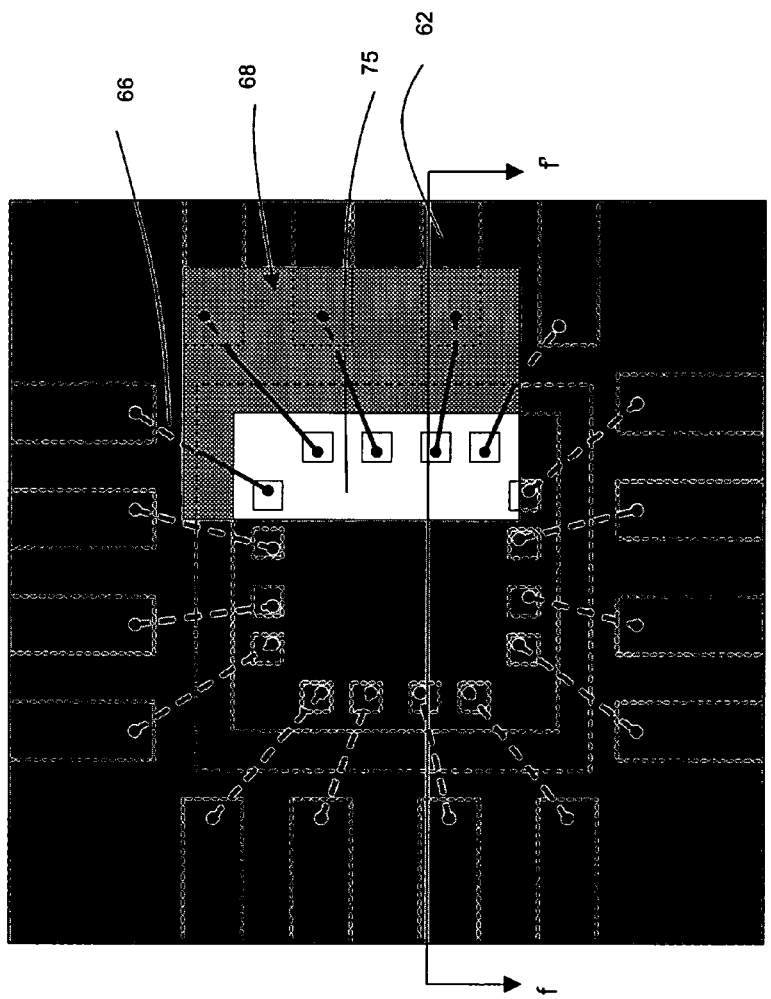
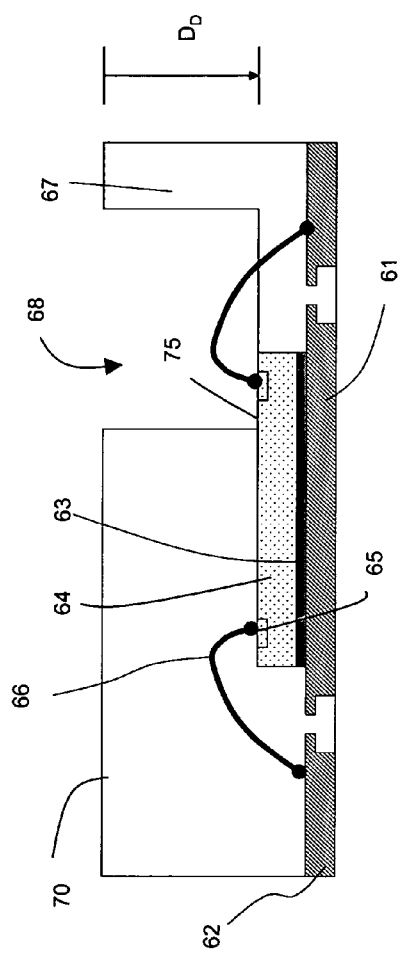
FIG. 6F-a
FIG. 6F-b

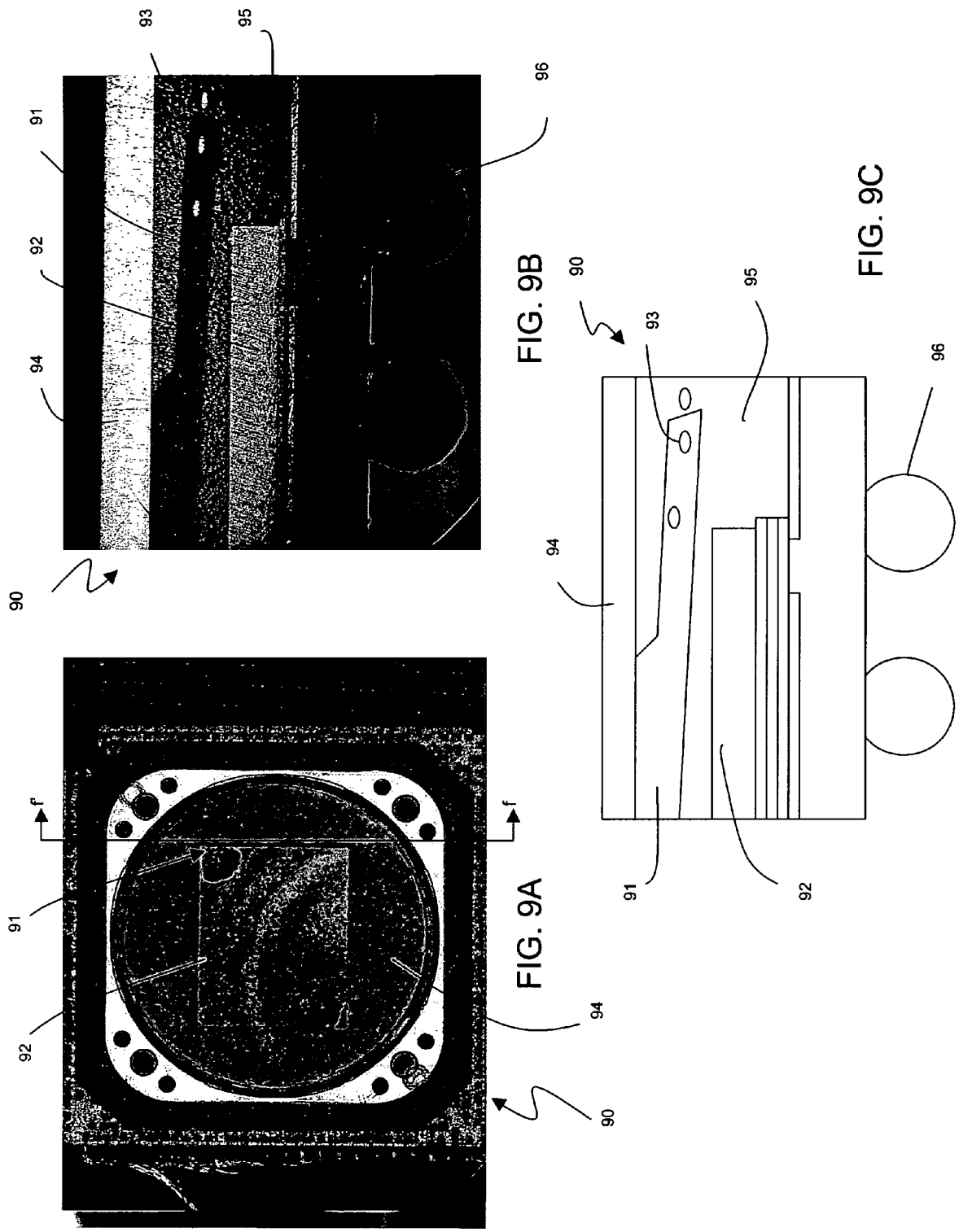

SEMICONDUCTOR FAILURE ANALYSIS TOOL

RELATED APPLICATIONS

This application claims priority to U.S. 60/695,477 filed Jun. 30, 2005, which is incorporated herein by reference in its entirety.

REFERENCE TO APPENDIX

This application includes a Computer Program Listing Appendix on one compact disc containing the following files, all of which information is hereby incorporated herein by reference in the entirety:

| FILE NAME | SIZE OF FILE IN KILOBYTES | DATE FILE CREATED |
|---|---|---|
| AboutDlg.asm | 287 kb | 6/29/2006 |
| CameraThread.asm | 272 kb | 6/29/2006 |
| CamSettingsDlg.asm | 61 kb | 6/29/2006 |
| CleaningPassDlg.asm | 292 kb | 6/29/2006 |
| CrossSectionDlg.asm | 292 kb | 6/29/2006 |
| CSAMWnd.asm | 116 kb | 6/29/2006 |
| CSISerial.asm | 17 kb | 6/29/2006 |
| DecapView.asm | 506 kb | 6/29/2006 |
| DigCtrl.asm | 145 kb | 6/29/2006 |
| DrawObject.asm | 96 kb | 6/29/2006 |
| DrawWnd.asm | 236 kb | 6/29/2006 |
| FATCAT.asm | 565 kb | 6/29/2006 |
| GProgressCtrl.asm | 93 kb | 6/29/2006 |
| KnobCtrl.asm | 220 kb | 6/29/2006 |
| LaserCalibration.asm | 676 kb | 6/29/2006 |
| LaserControl.asm | 349 kb | 6/29/2006 |
| LaserControlSHP.asm | 210 kb | 6/29/2006 |
| LaserSettingsDlg.asm | 130 kb | 6/29/2006 |
| MainFrm.asm | 727 kb | 6/29/2006 |
| MainFrmCMD.asm | 375 kb | 6/29/2006 |
| MainFrmMNU.asm | 268 kb | 6/29/2006 |
| MainFrmPST.asm | 752 kb | 6/29/2006 |
| MStatusBar.asm | 20 kb | 6/29/2006 |
| MultiImgCtrl.asm | 72 kb | 6/29/2006 |
| OverlayMgr.asm | 57 kb | 6/29/2006 |
| PCOMM.asm | 277 kb | 6/29/2006 |
| Registry.asm | 20 kb | 6/29/2006 |
| RTC4expl.asm | 191 kb | 6/29/2006 |
| SliderDlg.asm | 58 kb | 6/29/2006 |
| SplashScreen.asm | 144 kb | 6/29/2006 |
| Stdafx.asm | 161 kb | 6/29/2006 |
| TriButton.asm | 46 kb | 6/29/2006 |
| XYStageControl.asm | 347 kb | 6/29/2006 |
| ZoomControl.asm | 24 kb | 6/29/2006 |

FIELD OF INVENTION

This invention relates generally to the field of microelectronics, and more particularly to systems and methods for removing or sectioning materials in order to perform failure analyses on microelectronics devices.

BACKGROUND OF THE INVENTION

A typical microelectronics device includes a semiconductor die having a plurality of active bond pads that are wired to package leads of a lead frame. Plastic molding compound is injected around the die, wires and lead frame to form the typical black plastic body that protects the device and its wire connections from the environment.

Recent advancements in packaging technologies include improvements in electrical performance, greater heat dissipation and development of material composition which improve the reliability of devices, all while the dimensions of device packages continue to shrink. With reduced geometries and greater complexity the isolation and analysis of defects has become a greater challenge. Depending on the nature of failure modes, such as shorts, opens, or high resistance, various non-destructive methods including Current Time Domain Reflectometry (CTDR), infrared imaging technology, Scanning Acoustic Microscopy (SAM), and x-ray computed tomography, are used to locate defects. When further physical analysis is needed, it is commonplace to remove the molding compound encapsulating the device.

Conventional decapsulation techniques utilize hot fuming nitric acid, sulfuric acid, or a mixture of the two. Removal of the package material can be selective by forming a sealed reaction volume about the area of interest with an O-ring which isolates the region undergoing decapsulation from the rest of the package. As the process cannot be directly observed, accuracy and repeatability of these techniques are limited. Also, as the geometry of the exposed area is determined by the size and shape of O-ring used, the process does not lend itself to opening up regions of irregular shape, or precisely targeting individual circuit elements. In many cases, failure analysis requires that electrical functionality be maintained after decapsulation to determine the root cause of the device failure. However, metal lines and other materials are severely attacked by chemicals used in conventional wet decapsulation processes. This is especially problematic when only a few failed units are available for isolating defects and determining the root cause of the failure.

Cross-sectioning of microelectronic packages is a valuable analytical procedure widely used within the semiconductor industry. This has been a time-consuming process wherein a device is first sectioned along a plane which is a considerable distance from the area of interest in order to avoid damage to the area of interest during the cutting process. The device is then slowly polished along the plane to remove material until a desired feature becomes exposed along an internal plane for examination. The technique is used in a variety of applications, including package qualification, monitoring of the manufacturing process, incoming quality control, and analysis of failed parts. It can provide results that are unambiguous and can be used as either a sole source of information or a means of validating data gathered from other analytical procedures. Cross sectioning of microelectronic components has been performed using techniques similar to those used in the metallurgical industry. For example, samples can be sectioned with a diamond saw, then mounted in an epoxy matrix and subjected to a series of successively finer fixed abrasives for the material removal process, often being polished to the final finish with an aluminum oxide or similar slurry. While sawing has been adequate for structural or failure analysis of large defects, it has become less effective for failure analysis as the size of defects gets smaller. This is because saw technology is of limited accuracy and imparts high mechanical stress, often resulting in deformation and micro-cracking. Subsequent polishing to remove deformations and fractures is also a very time-consuming process.

SUMMARY OF THE INVENTION

According to the invention, systems and methods are provided for removing material from a packaged electronic device of the type encapsulated with a protective material that forms an outer surface of the device. An exemplary system includes a stage for placing the device in a first position for receiving laser radiation to remove the material by ablation, and for placing the device in a second position for viewing one or more features along the outer surface of the device. An optical system is configured to provide an exterior image, including one or more features along an exposed surface of the device, while the device remains in the second position. A viewing system displays a captured image of the device, including one or more features interior to the protective surface, overlayed with the exterior image for simultaneous viewing of both images so that a position of a first feature present in the captured image can be viewed in relation to a position of a second feature in the exterior image. The combination of the first feature position and the second feature position can be used to define a region of the device for material removal with a laser. In an associated method for removing material from a packaged electronic device, a captured image of the device is provided, the image including one or more features interior to the protective surface. One or more features along the outer surface of the device are viewec with an optical system while the device remains on a stage, the optical system providing an exterior image. The captured image is combined with the exterior image for simultaneous viewing so that the position of a first feature present in the captured image can be viewed in relation to the position of a second feature in the exterior image. A region is defined for decapsulation based on the position of the first feature relative to the position of the second feature.

In a method of end point detection useful in a decapsulation process a a sequence of steps, including two or more laser ablation steps, is peformed on a packaged electronic device of the type encapsulated with a protective material that forms an outer surface of the device, in which material of a first layer is removed from a region of the device until a final exposed surface within the region extends to a sufficient depth below an upper exterior surface of the device, wherein the sequence exposes a second layer underlying the first layer. The sequence includes viewing intermediate exposed surfaces between laser ablation steps with an optical system including a central focal axis orthogonal to a viewing plane along one of the intermediate exposed surfaces, said viewing performed with illumination from a first source along the viewing plane at an angle, measurable along a direction of the focal axis, of 20 degrees or less.

Another method of removing material in a decapsulation process includes performing a sequence of steps, including two or more laser ablation steps performed along scan paths, on a packaged electronic device of the type encapsulated with a protective material that forms an outer surface of the device, in which material of a first layer is removed from a region of the device until a final exposed surface within the region extends to a sufficient depth below an upper exterior surface of the device. The sequence exposes a second layer underlying the first layer. The sequence includes viewing intermediate exposed surfaces between laser ablation steps with an optical system including a central focal axis orthogonal to a viewing plane along one of the intermediate exposed surfaces. The viewing may be performed with a lighting system providing illumination from a first source along the viewing plane positioned at an angle, measurable along a direction of the focal axis, of 20 degrees or less. The lighting system provides illumination, from one or more second sources, along the viewing plane at an angle, measurable along a direction of the focal axis, ranging between 15 degrees and 75 degrees. Variability in illumination from the first and second sources enables provision of variable contrast of features exposed for viewing in the external image during multiple stages of material removal.

In a method for preparing a packaged electronic device, of the type encapsulated with a protective material that forms an outer surface of the device, for analysis, a captured image of the device is provided, the image including one or more features interior to the protective surface. One or more features along the outer surface of the device are viewed with an optical system while the device remains in a reference frame. The optical system provides an exterior image. The captured image is combined with the exterior image for simultaneous viewing so that the position of a first feature present in the captured image can be viewed in relation to the position of a second feature in the exterior image. A cut line is defined along the outer surface for sectioning the device based on the position of the first feature relative to the position of the second feature.

In still another enmbodiment, a method of decapsulating a semiconductor device to expose a die surface therein includes a bulk decapsulation step, a selected area decapsulation step and a clean-up decapsulation step. The bulk decapsulation step exposes the encapsulation material to a continuous multi-pass scanning pulsed laser beam wherein the bulk decapsulation step removes a portion of an encapsulation layer in a predefined region. The selected area decapsulation step is exposes encapsulation material in the region to a single pass scanning laser beam pattern wherein the pattern excludes selected areas from the beam scan to expose a portion of the die surface. The clean-up decapsulation step, exposes encapsulation material, remaining in the region after the portion of the die surface becomes exposed, to one or more additional single-pass scanning laser beam patterns different from the beam pattern of the selected area decapsulation step, wherein the clean-up step removes a further portion of the encapsulation layer to further expose the die surface, and laser settings for the clean-up decapsulation step are adjusted relative to the selected area decapsulation step.

BRIEF DESCRIPTION OF THE DRAWINGS

The invention will be more clearly understood from the following detailed description of exemplary embodiments when read in conjunction with the drawings, wherein:

FIGS. 4A-4B are cross sectional views illustrating illumination methods;

FIGS. 6A-a and 6A-b to 6F-a and 6F-b are plan views and cross sectional views, respectively, of a QFN package at various stages during a decapsulation process according to the invention;

FIG. 9A is a SAM image of a Ball Grid Array package;

FIG. 9B is a cross-section image of the BGA package of FIG. 9A;

FIG. 9C is a schematic presentation of the image shown in FIG. 9B;

Like reference numbers are used to reference like features among the figures. Features presented in the figures are not drawn to scale.

DETAILED DESCRIPTION OF THE INVENTION

Figure 1:
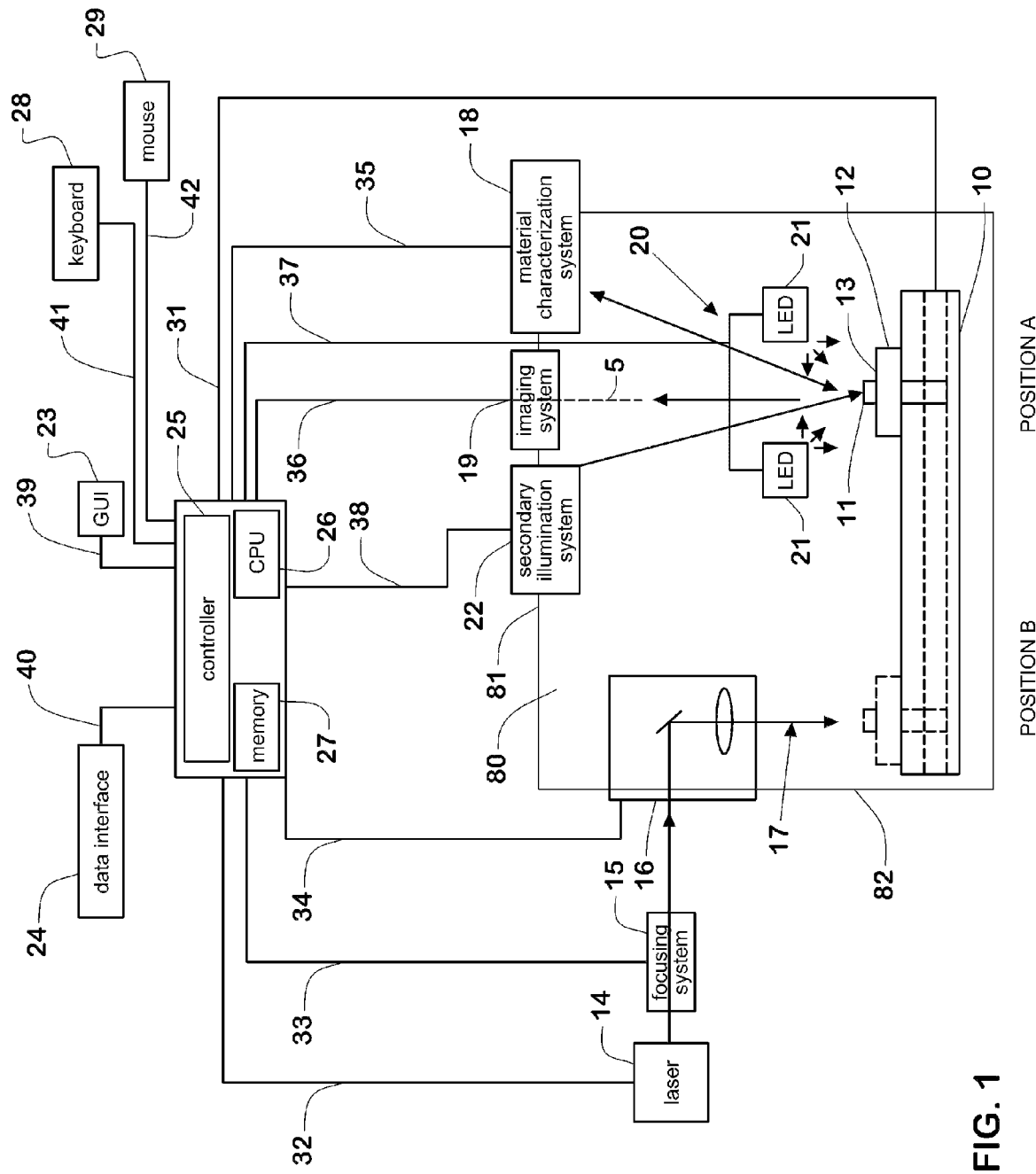
FIG. 1 illustrates in schematic form a system according to the invention.

Failure analysis of packaged semiconductor devices requires that there be minimal damage to the device in order to perform tests and determine the causes of failures. In the past, damage-free decapsulation and cross-sectioning of packaged semiconductor devices by laser ablation has been difficult to achieve, in part because ablation threshold values differ among the various materials encountered in the removal process. Further, the most common package materials are not homogenous in nature. It has also been found that the density of package material can vary significantly as a function of depth from the upper surface of the package. Both the removal rate and the mechanisms of removal in an ablation process can vary depending on material properties and numerous variables associated with the ablation process. Relevant variables include laser wavelength, beam power, pulse width and scan speed. Ablation is also affected by presence of materials such as silica filler, commonly incorporated in encapsulation material. These can create significant complications because they require higher energy input for ablation than do matrix polymers. Silica fillers also exhibit optical reflection effects that make it more difficult to remove other near-by materials.

Non-uniform distribution of air pockets in the encapsulation material also affects the ability to control the removal rate along a scan path. The rate of ablation and depth of material removal can be greater in more porous regions than in regions of less porosity and greater density. Consequently, during an ablation process, transitions in material composition can initially occur in small portions of a scanned region, e.g., breakthrough to a semiconductor dielectric overcoat, while the remainder of a scanned region remains covered with a dissimilar overlying composition such as encapsulation material. When this occurs, continued scanning over the same region can result in various forms of damage within and below the newly exposed material. For these reasons, laser ablation has not been a reliable method for damage-free removal of materials in packaged semiconductor devices.

By way of further illustration, when metal bond wires are exposed during the process of removing plastic encapsulation material by laser ablation, the wiring can be damaged by laser-induced heating. Numerous examples of melting and vaporization have been reported in the literature. Therefore, a primary consideration when using laser ablation to perform decapsulation or cross sectioning of semiconductor devices should be the control of temperature in the bulk material in order to prevent thermal damage to various components, such as metal wires, dielectric materials, solder balls, and polyimides.

According to certain embodiments of the invention, laser cross-sectioning can provide a high quality surface finish with less damage, e.g., micro-cracking, than achievable with a mechanical sawing process. The laser cut can be made closer to the areas of interest, thereby minimizing subsequent polishing. The cut groove, or kerf of laser ablation can be less than 100 microns, which is significantly smaller than the minimum achievable kerf of a mechanical saw, e.g., on the order of 300 microns. A smaller kerf effects more a precise cut. In the past, a drawback of using laser ablation to cross-section microelectronic components has been the limited ability to define an optimal cutting plane in order to analyze very small defects.

Ablation mechanisms which remove organic polymers with ultra-violet radiation can be very different from mechanisms which remove the same material with ;infrared or visible laser radiation. Ablation with infrared or visible radiation can be mainly a photo-thermal mechanism, while UV laser ablation often involves direct photo-chemical dissociation. With a photo-thermal mechanism, ablation can occur when the laser deposits enough energy within the material to cause vaporization. With a photo-chemical mechanism, absorption of photons leads to a direct dissociation of molecular bonds.

According to certain embodiments of the invention, process settings for decapsulation and cross sectioning of packaged semiconductor devices can be selected (i) to maximize photo-mechanical mechanisms, based on fracture of material receiving energy from laser radiation, and (ii) to minimize bulk heating that can lead to melting and vaporization, this resulting in reduced damage to the device. Still, damage-free package decapsulation is affected by material properties of the molded package compounds and other variables such as internal package dimensions, variations in density, and the distribution of silica filler and air pockets. The size and location of metal, especially bond wires, must be determined in order to avoid damage as they become exposed.

Laser decapsulation of hybrid packages presents even greater challenges because components often extend to varying heights relative to the upper surface of the package material. At a given level, wiring of one component may be exposed while a short distance away there may still be package material above the wiring of another component. When the encapsulation material contains a large amount of silica filler material, commonly of varied shape and size, a non-uniform ablation front can result as the silica filler is removed at a different rate than the bulk package material. This can present an unpredictable exposure of underlying, more sensitive, material, increasing the possibility that such sensitive areas will be exposed to damaging laser ablative effects.

It has been observed that a vertically oriented silica flake may disperse the laser beam and reduce ablation energy in the vicinity of the flake. The high aspect ratio of the flake and the vertical orientation of the flake can impede or prevent removal of surrounding material, i.e., the silica flake acts as a micro-mask during subsequent laser scans. This results in formation of pillars of residual encapsulation material.

During ablation, photo-thermal effects and photo-chemical bond rupturing can result in the deposit of volatile species on the removal region. This can impede the effectiveness of subsequent laser ablation scans and increase the risk of incurring adverse thermal effects on both the removal process and the integrity of the device.

As the power in a pulsed laser beam is increased, the ablation rate can decrease because the ablation plume of volatile species can block the beam—even though the theoretical rate of photo-chemical bond rupturing continues to increase with increasing power. A reduction in power may be necessary to limit condensation.

The goal of a damage-free decapsulation process must be achieved at an acceptable removal rate by minimizing a variety of thermal effects, condensation of volatiles and formation of artifact which result in non-uniform removal. To the extent these adverse effects cannot be completely prevented, systems and methods are now provided to (i) monitor the removal process, (ii) adjust parameters to control the removal mechanisms and (iii) adjust parameters to control the removal rate, in order to minimize damage. In other embodiments of the invention, when it is not possible to modify parameters to influence these effects, the scanning of laser ablating radiation can be modified to avoid imparting damage to features.

For example, scanning can be controlled in a manner which avoids transferring beam energy to relatively sensitive or vulnerable regions while continuing the ablation process in other regions.

In accordance with an embodiment of the present invention, each step in a multi-step ablation process comprises specific laser ablation attributes. The exemplary processes can minimize bulk heating, formation of stalagmites and condensation of volatile species.

FIG. 1 schematically illustrates a laser ablation system 1 for decapsulation of a semiconductor device 11 such as an integrated circuit package. The system includes a chamber 80; a laser 14; a beam focusing system 15; a laser scan head 16 for directing the energy beam toward the target device; a stage 12 to hold the semiconductor device; a station 10 for positioning the stage 12 between a POSITION A where inspection and decapsulation patterns are programmed and a POSITION B where the laser ablation is performed; a controller, illustrated as a microprocessor-based computer system 25, for controlling operation of the system, and operator interface elements, illustrated as a Graphic User Interface (GUI) 23, a keyboard 28, and a mouse 29.

The exemplary system 1 is also shown to include an imaging system 19; a primary illumination system 20 with a plurality of light emitting diodes 21; a secondary illumination system 22 such as a fiber lighting component; and a data interface 24 for importing related data such as non-destructive examination data previously obtained from the device. The system 1 may also include an optional material characterization system 18, such as a Laser-Induced Breakdown Spectrometer (LIBS). Instructions for the interactive control of these various components of the system 1 may be in the form of executable code resident in a memory 27 of the computer system 25 and controlled by an associated central processing unit 26.

The laser scan head 16, mounted on the side wall 82 of the chamber 80 near the upper wall 81 controllably directs the laser beam 17 toward the semiconductor device 11. The laser 14 may be any suitable pulsed laser, such as a YAG or a Yb fiber laser. The pulse frequency and power of the laser 14 are adjustable in order to control the influence of different removal mechanisms (e.g., minimizing thermal effects while maximizing photomechanical ablation) in order, for example, to remove plastic encapsulant from the semiconductor device 11 without causing damage to the integrated circuit. The interior of the chamber 80 is illuminated by the primary illumination system 20. Operation of the laser 14 on the device 11 is observed through the imaging system 19, e.g., a video camera, mounted on the upper wall 81. The station 10 is an XYZ positioning table. As shown in FIG. 1, the device 11 is disposed at a substantially normal angle to the laser beam 17. The station 10 may also be operable to raise and lower the device 11 along the direction of the beam and may further include ability to tilt, i.e., move the surface 13 on which the device 11 is placed, in and out of a plane normal to the direction of the laser beam 16. This feature may be useful when it is desired to leave a thin layer of encapsulation material on the device 11 for contamination analysis with the material characterization system 18.

The system 1 may be operated manually, automatically or semi-automatically. In embodiments configured for manual or semi-automatic operation, the controller may be configured with one or more digital signal processors. For automatic and semiautomatic modes, suitable operating and applications software are loaded into the memory 27 from the database 24 in order for the CPU 26 to control operations of the various components of the system 1 via the control lines 31-42 that are respectively connected to at least the station 10, the laser 14, the beam focusing system 15, the beam scan head 16, the material characterization system 18, the imaging system 19, the primary illumination system 20, the secondary illumination system 22, the GUI 23, the data interface 24, the keyboard 28, and the mouse 29. The imaging system 19 allows an operator to see a suitable magnified color image of the device 11 via a Charge Coupled Device (CCD) camera and image-capture software.

The laser beam 17 may be of a wavelength in the range of 193 nm to 2 microns. It has been found that wavelengths in the range of 1000 to 1100 nm, e.g., 1060 nm, are especially useful for decapsulation and cross sectioning of plastic molding compounds. An incident beam tuned for optimum power in this energy range can promote molecular rearrangement and ultimately compositional breakdown of polymerized resin molecules. Resulting ablation may be a combination of photo-thermal, photo-chemical, and photo-mechanical mechanisms. In certain embodiments, the predominant mechanism is photomechanical with minimal photothermal and photolytic effects.

Figure 2B:
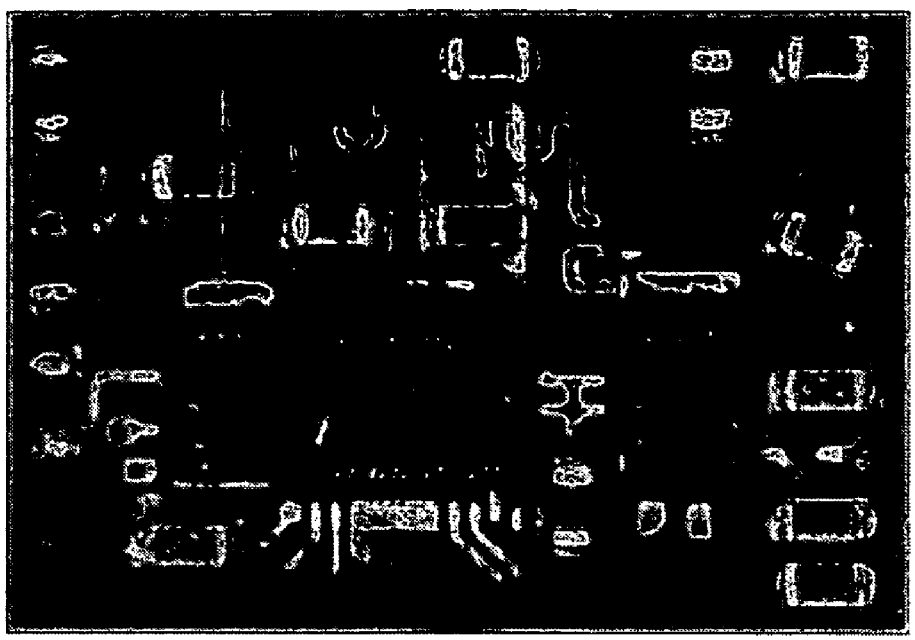
FIG. 2B is a plan view of the device shown in FIG. 2A after decapsulation according to the invention.
Figure 2A:
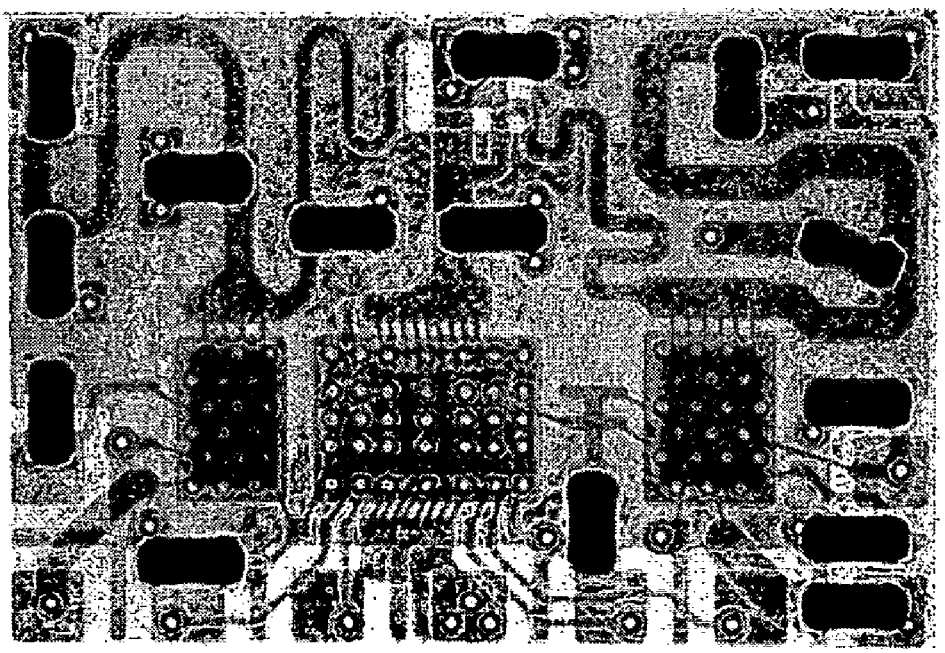
FIG. 2A is an x-ray image showing a plan view of a semiconductor device.

In operation, the device 11 is mounted on the surface 13 of the stage 12. Either manually or with the assistance of the computer system 25, the device 11 is appropriately positioned along an X, Y plane of the station 10 relative to the central focal axis 5 of the imaging system 19, the plane being orthogonal to the direction of the laser beam 17. The stage is moved to POSITION A for generation of a first decapsulation pattern with the aid of an imported image from a non-destructive failure analysis tool such as a Scanning Acoustic Microscope (SAM) or an X-ray analysis tool. The imported image of the device 11 is scaled and overlaid with the image obtained by the imaging system 19 for viewing on the GUI 23, e.g., a video screen. Features visible in the X-ray or SAM image, but not observable in the camera image, can be located relative to coordinates of the camera image. The area to be scanned with the laser 14 for decapsulation by ablation is visually selected by the operator using, for example, a cursor. With this method, the accuracy of navigation is on the order of 10 microns which is sufficient for avoidance and protection of thermally sensitive areas during laser decapsulation. With resident software the defined ablation area, e.g., in the form of an image, is converted to a vector file for programming of a beam scanning routine. The station 10 is then controlled to move the device 11 to the POSITION B to execute the laser scanning routine for ablation. After the scanning routine for ablation is executed, the station 10 is then controlled to move the device 11 to the POSITION A for camera inspection. FIG. 2A illustrates an x-ray image of a multi-chip module imported from the database. The module has three wire bonded dies and fourteen surface mount devices. FIG. 2B is a digital camera image of the same module after decapsulation.

Figure 3B:
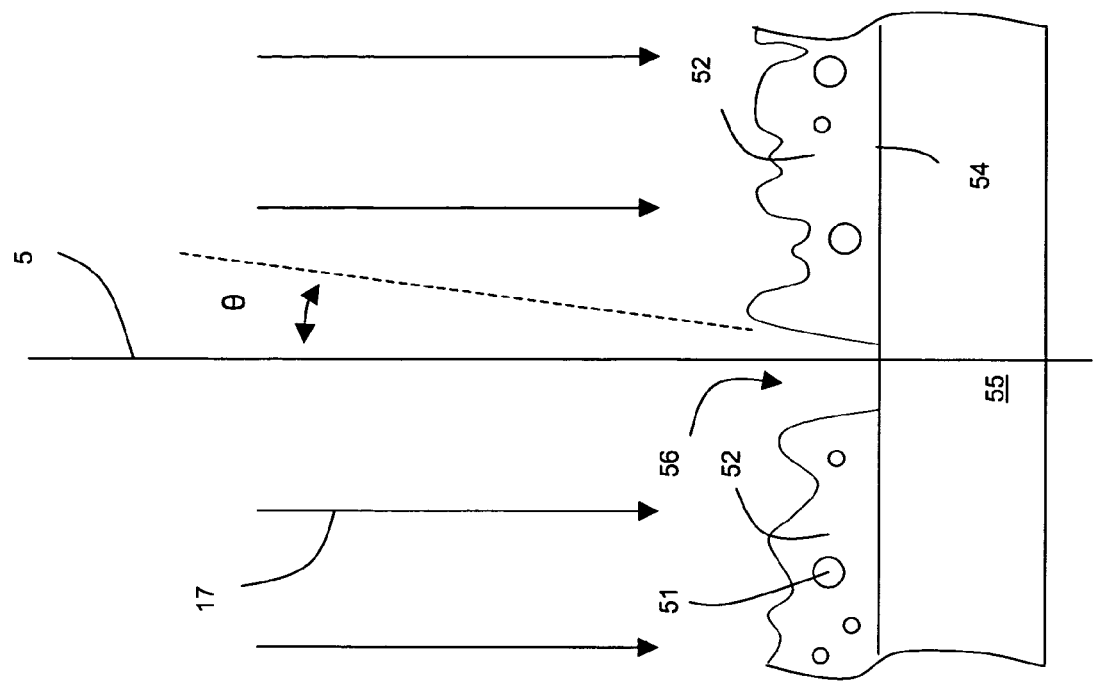
FIGS. 3A and 3B are cross sectional views schematically illustrating an ablation feature.
Figure 3A:
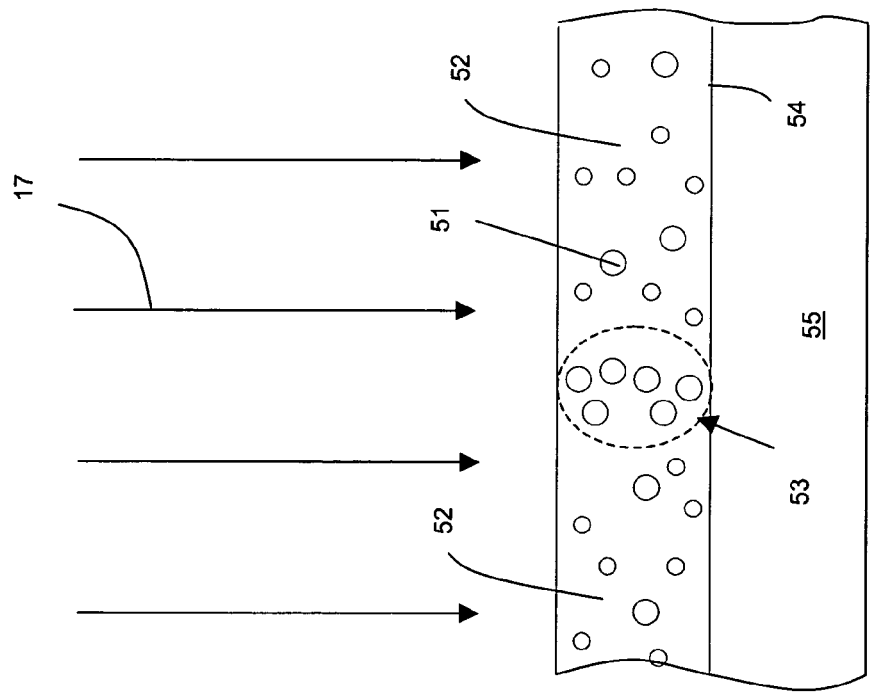

With variations in molding compound density and variations in the distribution of silica filler and air pockets, ablation of encapsulation material is not uniform. As multiple laser scans remove a first thickness of material, early detection of when an underlying second material becomes exposed can be critical to preventing damage to that second material by laser power which may melt or otherwise destroy the integrity of an associated feature. FIGS. 3A and 3B illustrate the effect of ablation on a region having a non-uniform distribution of air pockets. A relatively porous region 53 containing a cluster of air pockets 51 shown in FIG. 3A can be susceptible to a faster rate of removal by ablation than adjoining regions 52 formed of denser, less porous material. This can result in the profile shown in FIG. 3B wherein an ablation of the porous region 53 can result in a narrow opening 56, (e.g., less than 25 microns wide) that exposes underlying material 55 while the adjoining regions 52 have not been completely removed. Typically the profile, i.e., the ratio of depth-to-width, of the narrow opening 56 is so large that illumination of the underlying second material must be with a light source positioned at a relatively steep angle (theta), measured from the central focal axis 5 of the camera. With the axis 5 orthogonal to the X,Y plane of the station 10, according to the invention, the underlying material exposed in the opening 56 is illuminated from a source positioned at a small angle relative to the focal axis 5, e.g., less than 10 degrees from the camera axis 5 generally at an angle within 20 degrees of the axis 5. Otherwise, it is difficult or impossible for an operator or a vision system to detect the existence of the narrow opening 56, which may be less than 5 microns in width or in a range including 10, 15, 20 and 25 microns. However, with a combination of such direct illumination at an angle within 20 degrees of the axis 5 and a high resolution optical magnification camera, e.g., 7×, an operator can visually identify small openings such as the opening 56 and recognize the need to change ablation removal settings before continuing removal of material. Such identification may also be achieved with various combinations of optical and digital magnification.

Thermal damage from overexposure to the laser beam can be further minimized by repeatedly selecting areas for receiving additional laser exposure with a digitized image in order to sequentially remove more of an overlying layer without causing damage to an exposed underlying layer. By setting an appropriate threshold of image brightness or contrast to discriminate between, for example, encapsulation material and an underlying second material, additional decapsulation can be performed only in regions which exceed (or are less than) the threshold level. This is effected by programming the scanning routing to blank the laser beam out in regions having brightness levels that are above, or below, a threshold criterion. For example, with regions where the encapsulation material has already been removed such that metal features are exposed, the combination of scanning routing and shuttering can be programmed to not ablate the exposed metal features by avoiding regions having an illumination above a designated threshold.

The resolution of the digital image depends on the image brightness and contrast and the pixel size of the camera. High image brightness may be best achieved by placing multiple light sources a suitable distance from the target device. For example, with the device 11 in the POSITION A, a plurality of Light Emitting Diodes (LEDs) 21 in the illumination system 20 are placed sufficiently close to the device 11 to provide suitable light intensity for setting a threshold criterion of illumination without thermally affecting the device 11. High contrast may be best achieved when the LED illumination is at an oblique angle. The oblique angle may range, with respect to the direction of the axis 5, from 15 degrees to 75 degrees and illumination from an angle of about 45 degrees is useful. The LEDs 21 may be placed on swivel heads to further adjust the angles of illumination. As illustrated in FIGS. 4A and 4B, features such as a residue-containing pillar region 7 and a trench region 8, which can result from non-uniform ablation, can be illuminated with direct beam illumination 6a, or oblique angle illumination 6b. Illumination from an oblique angle within the above-noted range, e.g., from 30 to 60 degrees relative to the direction of the axis 5, can increase the image contrast of these regions by enhancing shadowing effects. As the surface of the encapsulation material is non-uniform, improvement of image contrast may also be had with combined illumination from the primary oblique angle illumination system 20 and the secondary high angle illumination system 22. By changing the amount of high angle illumination, the operator can find a suitable contrast for a complex surface topography. The enhanced image is converted to a gray scale to select the areas which are to receive further laser radiation energy for continued decapsulation. Areas to be excluded from additional ablation include the highly reflective metal wires and exposed dies. It is also necessary to exclude the area where the removal of material is extensive. Light reflection from this area is less when the oblique angle illumination is used. Using a double threshold technique, both the highly reflective areas and the low reflective areas are excluded from the subsequent laser beam passes.

Figure 5:
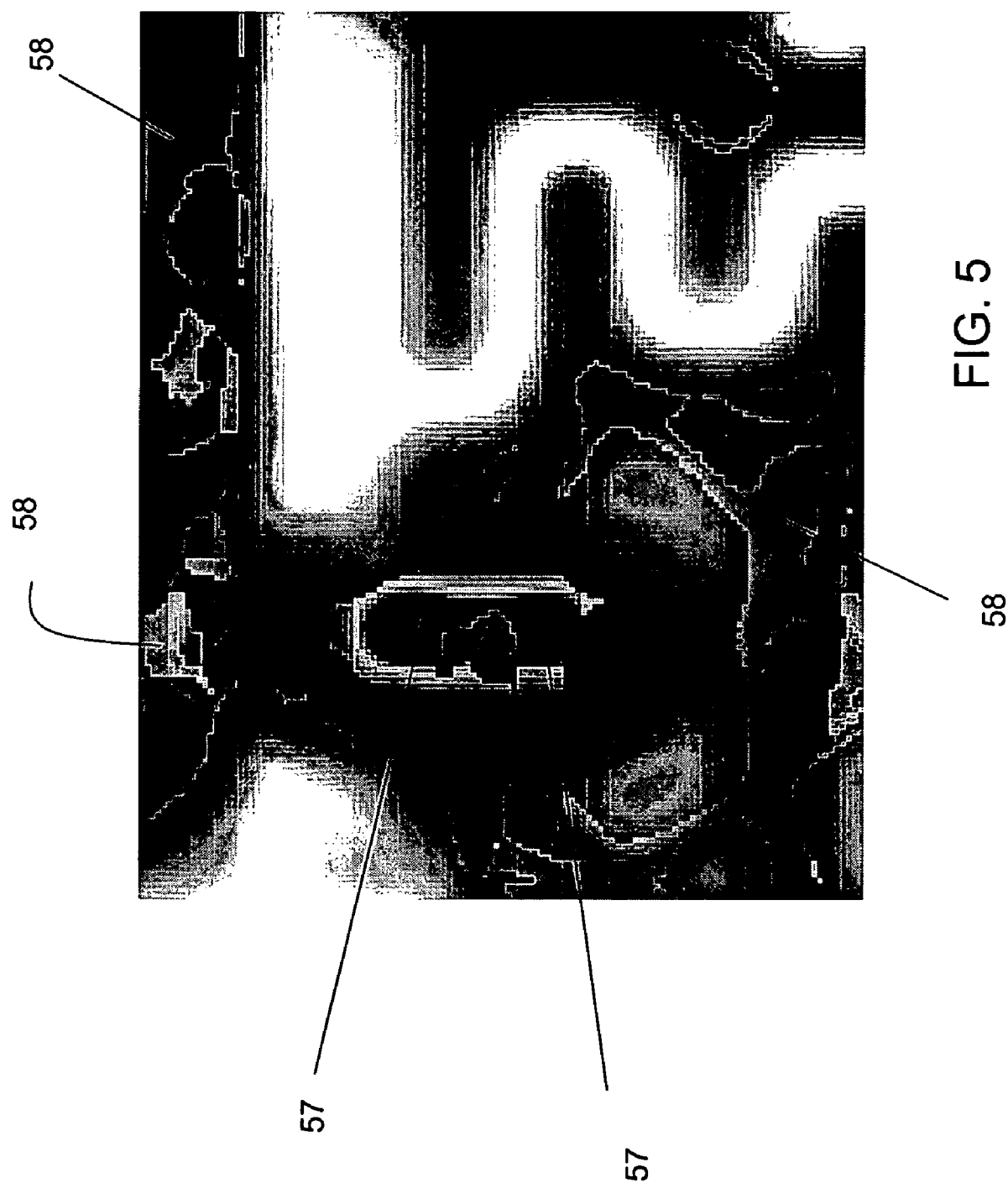
FIG. 5 is a gray scale image providing a plan view of a device according to the invention during a stage of decapsulation.
Figure 7:
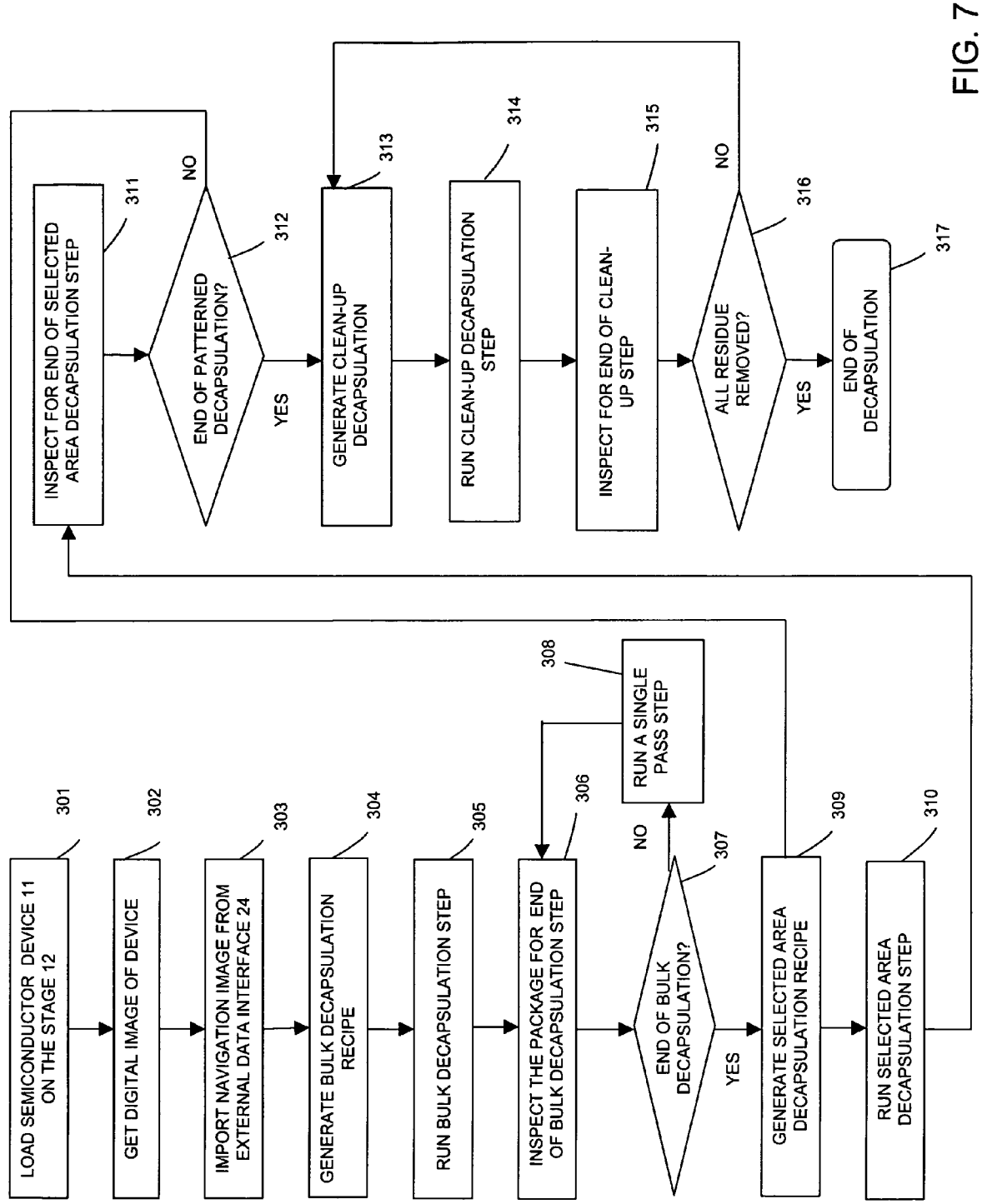
FIG. 7 is a flow chart illustrating a decapsulation process according to the invention.

FIG. 5 illustrates a two-threshold method in an exemplary decapsulation process. With conventional grey scaling software the areas 57 are found to be highly reflective while the areas 58 exhibit a relatively low reflectivity. With an upper illumination threshold to exclude the areas 57 and a lower illumination threshold to exclude the areas 58, the system 1 is programmed to ablate only the regions having illumination values between the two thresholds. A single threshold criterion would be used when, for example, highly reflective areas such as exposed metal wires, are to be excluded.

FIGS. 6A-a and 6A-b to 6E-a and 6E-b sequentially illustrate, in plan and cross-sectional views, a method of decapsulating an exemplary Quad Flat No-lead (QFN) package 100 for failure analysis. In FIG. 6A-a, an exemplary plan view of a QFN package 100 before decapsulation is shown with the die pad 61, leads 62, the semiconductor die 64, bond pads 65 on the die 64, metal bond wires 66, encapsulation material 67, and an initial volume 68 to be removed. FIG. 6A-b illustrates, in a cross-sectional view taken along line a-a' of the FIG. 6A-a illustration of the package 100, the die pad 61, leads 62, die attach material 63, the semiconductor die 64, the bond pads 65, the bond wires 66, encapsulation material 67, the initial volume 68 to be decapsulated, i.e., to a decapsulation depth $D_D$ extending to the die surface 69 from the upper package surface 70. In an example sequence, an operator downloads to the computer system 25 a decapsulation instruction set to program the laser ablation system 1 for removal of the volume 68 in the device 11. The instruction set may include the Computer Aided Design (CAD) drawings of the device 11 or corresponding dimensional information, materials known or believed to be used in the construction of the device 11, expected ablation rates for each material layer to be removed, and other information necessary for decapsulation.

Next, the device 11 is manually placed on the stage 12 at the inspection position (i.e., POSITION A shown in FIG. 1). Using the illumination provided by the primary illumination system 20, a magnified digital image of the device is obtained with the imaging system 19 and is displayed on the GUI 23. The primary illumination system 20 provides a high level of illumination with relatively low heat generation to minimize heating of the device 11. In the embodiment illustrated in FIG. 1, a plurality of LEDs 21, each mounted on a swivel head, provide an oblique angle of illumination to create high image contrast. The imaging system 19 has a suitable magnification capability with, for example, a combination of optical and digital magnification, with multiple focal settings. With a suitable image formed of the device 1, an image file containing the internal structure of the device 11 is imported from the database 24. The imported image file may be provided based on any suitable non-destructive analysis technique, and may include information on location of defects or failures as well as dimensional information of the device structure. The image file may be based on x-ray analysis, Scanning Acoustic Microscopy (SAM), or other non-destructive analysis techniques. With the decapsulation instruction set from the computer system 25, the images obtained from the system 19 and the image file are scaled for overlay such that the operator can generate an ablation pattern for the first step of decapsulation, herein referred as the Bulk Decapsulation step.

Process settings for the Bulk Decapsulation process are programmed in order to perform multiple sets of beam scans. Multiple sets of beam passes facilitate uniform removal of encapsulation material. The operator then moves the stage 12 to the ablation position (i.e., POSITION B in FIG. 1) and the Bulk Decapsulation proceeds with the selected process settings and the pattern. During the multi-pass decapsulation process, the laser beam 17 scans the device 11 in a vector scan mode using a set of beam galvanometers (not shown) in the beam scan head 16. After the multi-pass process is complete, the stage is moved back to the POSITION A so that the device 11 can be inspected with the imaging system 19 to determine whether any bond wires 66 are exposed. Illumination of the device 11 with the system 20 set at an oblique angle, combined with high magnification, enables detection of metal wiring in very small exposed areas 71, such as has been illustrated in FIGS. 6B-a and 6B-b, on the order of 10 microns in diameter, or less. If no exposed metal wire is detected with the high magnification inspection, an additional set of one-pass laser ablation scans is made using the Bulk Decapsulation process settings. After the additional scan the device 11 is re-inspected following the afore-described inspection procedure. The single pass set of scans and subsequent inspection may be repeated as needed until an area of exposed metal wire is detected. This concludes the Bulk Decapsulation step.

The plan view of FIG. 6B-a illustrates the QFN package 100 after the Bulk Decapsulation step is complete, with small areas 71 of metal wires exposed. The cross-sectional view of FIG. 6B-b, taken along line b-b' of FIG. 6B-a, illustrates the package 100 decapsulated to the depth $D_1$ relative to the upper package surface 70. When an area of exposed metal wire is detected, e.g., small areas 71, the operator can generate a revised decapsulation pattern from the camera image to define a laser beam scanning pattern which avoids the areas 71 in the next decapsulation process step, herein referred as the Selected Area Decapsulation Step. In order to further protect metal wires from laser beam damage during subsequent scans, the operator can prepare a micro-decapsualtion pattern generated from a high magnification image obtained with the imaging system 19 with a single grey scale threshold setting. Illumination of the image can be manually adjusted to provide suitable contrast between the metal wire areas and the rest of the exposed surface within the volume 68, and set a threshold of illumination to exclude the metal wires from additional beam exposure.

The Selected Area Decapsulation step is performed with single passes of laser scans. After each Selected Area Decapsulation pattern is generated, the operator moves the stage 12 to POSITION B and the Selected Area Decapsulation proceeds with the selected process settings. After each pass of laser beam scans is performed, the stage is moved back to the POSITION A in order for the operator to inspect the device 11 and determine by high contrast optical inspection whether any area of the upper die surface 69 is exposed using the high angle secondary illumination system 22. As noted with regard to the Bulk Decapsulation Step, the exemplary small angle off-axis illumination of the system 22, combined with high magnification, enables detection of metal wiring in very small exposed areas, such as has been illustrated in FIG. 3B, on the order of 10 microns in diameter, or less. The combination of small angle off-axis illumination by the system 22, and high magnification of the camera image, enables detection of small exposed areas of the die surface 69. If there is no exposed upper die surface area, the Selected Area Decapsulation process is repeated such that the operator selects a new scanning pattern with a single threshold setting which avoids any newly exposed area 72 of the bond wires 66 shown in FIG. 6C-a. That is, another single pass of laser scans is performed wherein the combination of laser scanning and shuttering is programmed to not ablate along the exposed areas 72 of the bond wires 66. After each additional set of scans the device 11 is re-inspected and then the sequence of another single pass of scans and subsequent re-inspection is repeated until an area of the upper surface of the die 69 becomes exposed. The maximum resolution of an exemplary Selected Area Decapsulation Step can be set to an arbitrary value such as a width of 25 microns or less.

The plan view of FIG. 6C-a illustrates the package 100 after multiple sets of laser ablation removal scans in the Selected Area Decapsulation Step expose an area 73 close to the top surface 69 of the die 64. The corresponding cross-sectional view shown in FIG. 6C-b, taken along line c-c' of FIG. 6C-a, illustrates the area 73 at depth $D_2$ with additional area 72 of metal wires exposed. With additional sets of laser scans further material is removed until any area of the upper die surface 69 is exposed.

FIG. 6D-a illustrates the end of the Selected Area Decapsulation step with an appearance of a very small exposed upper die surface area 75. The corresponding cross-sectional view shown in FIG. 6D-b, taken along line d-d' of FIG. 6D-a, illustrates the area 74 at a depth $D_3$ and an adjacent area 75 at depth $D_D$. The area 75 is likely to be in a small opening having a relatively large ratio of depth to width as described with respect to FIG. 3, such that detection may require illumination of the area 75 with a lighting source (e.g., system 22) positioned at a relatively steep angle, theta, e.g., 10 degrees, relative to the central focal axis 5 of the camera. With confirmation that the die surface 69 is partly exposed, the operator begins the Clean-up Step.

In the Clean-up Step, the process settings are changed to further reduce the risk of damage by laser beam ablation along the die surface. With the stage 12 in POSITION A, a removal pattern is generated using the gray scale technique wherein upper and lower illumination thresholds are selected by the operator. The scanning and removal pattern is generated based on the material which exhibits an illumination level between the two threshold values. The operator then moves the stage 12 to POSITION B and a single pass of scans is performed with newly selected process settings. After the ablation scans are completed, the stage is moved back to the POSITION A for re-inspection of the device 11 to determine whether an additional pass of scans is to be performed in accord with the Clean-up Step. If there is still a substantial amount of residual encapsulation material, one additional set of clean-up scans are run and the device 11 is re-inspected. If there is still a substantial amount of residual encapsulation material, one additional set of clean-up scans are run and the device 11 is re-inspected. Sequences of single passes of clean-up scans and re-inspection are performed until the clean-up is complete. The resolution of an exemplary Clean-up Step can be 25 microns or less.

The plan view of FIG. 6E-a illustrates the package 100 during an interim stage of the Clean-up Step. The majority of the portion 75 of the top surface of the die 64 within the volume 68 is exposed, there remaining some residual encapsulation material 77. The cross-sectional view of FIG. 6E-b, taken along line e-e+ of FIG. 6E-a, illustrates the exposed top surface area portion 75 of the die 64 that is within the volume 68. Also illustrated are the residual encapsulation material 77 along the surface portion 76, the depth $D_4$ of the residual encapsulation material surface on the die 64, and the final decapsulation depth $D_D$. In the next ablation scan, only the area 76 with residual encapsulation material 77 is exposed to the laser beam. The plan view of FIG. 6F-a illustrates the package 100 after completion of the Clean-up Step with a fully exposed top surface portion 75 of the die 64 generally free of residual encapsulation material 77. The cross-sectional view of FIG. 6F-b, taken along line f-f of FIG. 6E-a, also illustrates the exposed top surface 75 of the die 64 and the decapsulated area free of residual encapsulation material 77.

For the exemplary package 100, the distance from the top surface 70 of the package to top of the bond wires D1 is about 250 microns and the distance from the top surface 70 to die surface $D_D$ is about 400 microns. In the first step, i.e., the Bulk Decapsulation Step, an exemplary encapsulating material 67 is removed to an extent which exposes metal bond wires at a depth of about 260 microns from the top surface 70 of the package as shown in FIG. 6B-b. The Bulk Decapsulation Step can begin as a continuous ablation sequence with multiple sets of beam scans which can render a relatively uniform ablation surface. This can be followed by single sets of beam scans, i.e., single passes over each area, until exposure of metal bond wire can be visually confirmed by the operator or a recognition system, with assistance of the imaging system 19 and the primary illumination system 20. The process settings in the Bulk Decapsulation Step can be adjusted to maximize material removal with the photo-mechanical mechanism while minimizing thermal effects. Exemplary process settings of the Bulk Decapsulation step for small wire bond packages are:

| | |
|---|---|
| Laser beam wavelength: | 1060 nanometers |
| Laser beam energy density: | 41 Joules/cm² |
| Pulse frequency: | 20 kHz |
| Pulse width: | 100 nanoseconds |
| Beam size: | 25 microns |
| Beam scan speed: | 0.5 meter/sec |
| Scan overlap: | 10 microns |

The ablation rate of an exemplary molding compound is 70 microns/pass with the above process settings.

In the second step, referred as the Selected Area Decapsulation Step, the encapsulating material 67 is removed from the bond wire level to the upper die surface by repeating a single pass vector scan with a Selected Area Decapsulation pattern which is modified after each scan using a grey scale image based on a selected threshold of illumination. Features having an illumination level above the threshold level do not receive ablation energy. The power setting of the Selected Area Decapsulation step can be the same as that of the Bulk Decapsulation step in order to facilitate a more uniform ablation of the surface and to keep the dominant ablation mode photo-mechanical. In the Selected Area Decapsulation Step shuttering, to blank the laser energy out when the beam would pass over regions exceeding the threshold level scan, can be effected by programming the laser scan pattern to pass over metal regions without pulsing of the laser. This will prevent laser energy from impinging on, for example, the bond wires. The encapsulation material under the metal wires can nevertheless be removed by undercutting with the photo-mechanical ablation and removal mechanism. Exemplary process settings of the Selected Area Decapsulation Step for small wire bond packages are:

| | |
|---|---|
| Laser beam wavelength: | 1060 nanometers |
| Laser beam energy density: | 41 Joules/cm² |
| Pulse frequency: | 20 kHz |
| Pulse width: | 100 nanoseconds |
| Beam size: | 25 microns |
| Beam scan speed: | 0.5 meter/sec |
| Scan overlap: | 10 micron |
| Number of passes: | 1 and repeated after inspection with a high angle beam illumination |

With the above process settings the ablation rate of the exemplary molding compound can be about 35 microns/pass. In the third step, referred as the Clean-up Step, residual encapsulation material can be removed using the vector scan pattern generated from the grey scale image method with two threshold settings. The power setting is reduced from that of the Selected Area Decapsulation Step in order to minimize thermal damage by the laser beam 17. Exemplary process settings of the Clean-up Step for small wire bond packages are:

| | |
|---|---|
| Laser beam wavelength: | 1060 nanometers |
| Laser beam energy density: | 31 Joules/cm² |
| Pulse frequency: | 20 kHz |
| Pulse width: | 100 ns |
| Beam size: | 25 micron |
| Beam scan speed: | 1 meter/sec |
| Number of passes: | 1 and repeated after visual inspection |

With the above process settings, the ablation rate of the exemplary epoxy molding compound can be about 20 microns/pass.

Generally, settings for laser power, pulse frequency, beam scan speed, and beam overlap may be optimized for different package types and package parameters such as encapsulation material thickness, and underlying metal structures.

Figure 8:
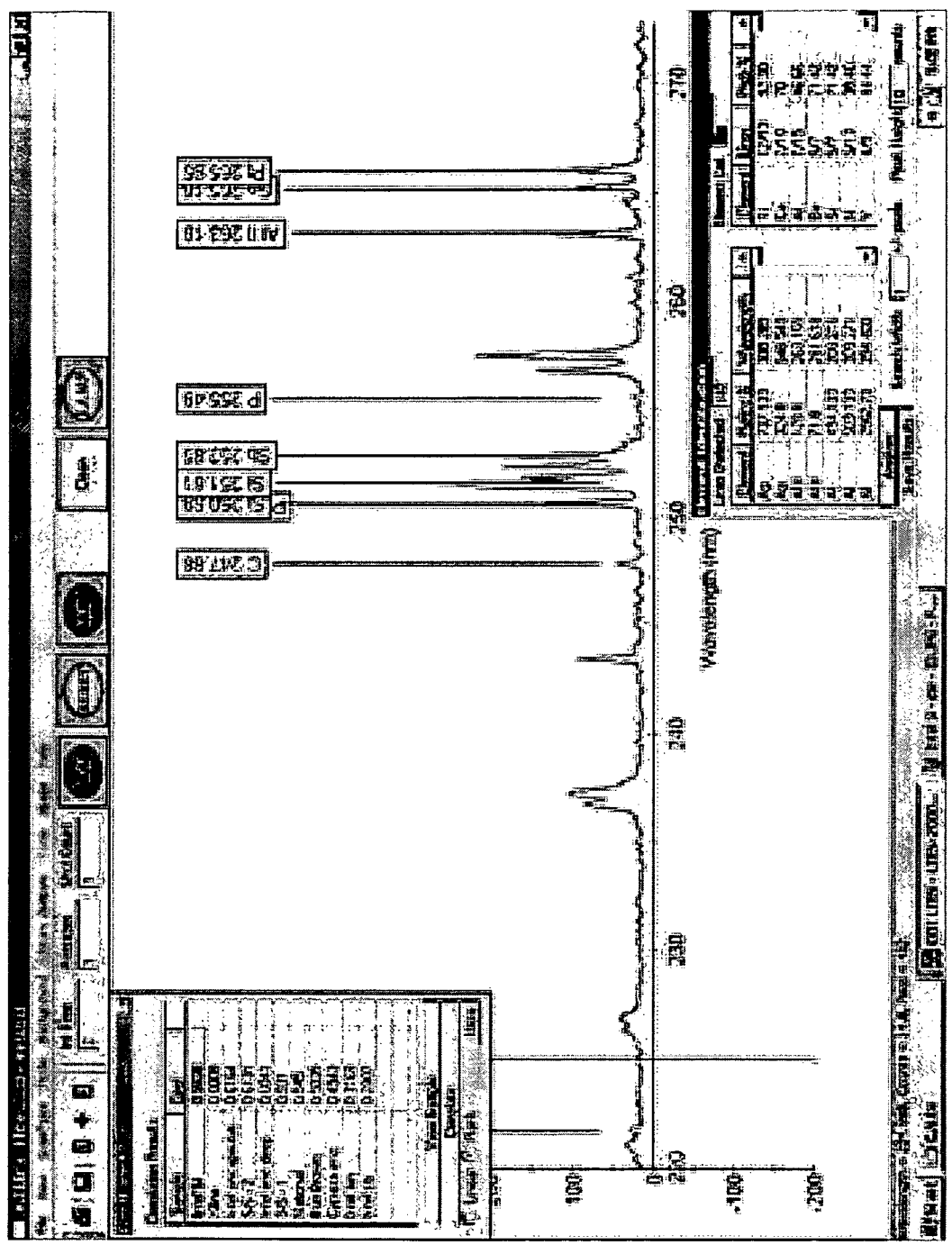
FIG. 8 illustrates a laser-induced breakdown spectroscopic analysis performed with the system of FIG. 1.

In another embodiment of the invention, the material characterization system 18, such as a Laser-Induced Breakdown Spectrometer (LIBS) system, is used for in-situ analysis of the contamination of the encapsulation material. The LIBS system, otherwise referred to as an alpha spectrometer is a detection system that permits real-time, qualitative measurements of trace elements in solids, liquids and gases. This broadband, high-resolution instrument includes a Q-switched pulsed laser which stimulates emissions for spectral analysis from 200-980 nm. A high-intensity, pulsed laser beam is focused on the sample area, positioned a suitable distance from the device 11. A single 10 nanosecond-wide laser pulse excites the sample. When the laser is fired, the high-temperature of the laser creates a plasma for analysis. As the plasma decays (~1.0 μsec after the laser pulse), excited atoms emit light of characteristic wavelengths distinct to each element. The multiple detectors in the broadband spectrum (200-980 nm) are used to acquire spectral information for material characterization and quantitative elemental analysis. FIG. 8 illustrates an example of a chemical analysis done on encapsulation material during laser decapsulation with spectral signals collected between 220 and 275 nm.

A feature of the invention is that images from other analytical tools such as Scanning Acoustic Microscopy (SAM), C-mode Scanning Acoustic Microscopy (C-SAM), or X-ray Computed Tomography (CT) can be overlaid on an image of the device captured on the stage 12 for identification and navigation of the laser ablation scans to reveal regions of interest and selectively avoid features of components and structures during part or all of the decapsulation process. This provides a high accuracy of decapsulation while protecting individual components. With this method, tailored decapsulation of packages with multiple suspected defects and multiple die configurations is achievable. FIG. 2B illustrates an x-ray image of a multi-chip module package which can undergo damage-free decapsulation according to the principles and methods described herein.

Advantageous features of using laser ablation techniques for cross-sectioning of integrated circuit packages include the accuracy of cross-sectioning, proximity to the defects and the ability to minimize damage such as formation of micro-fissures. These features enable provision of high quality surface finishes with minimum removal of material by polishing. The materials from which integrated circuit packages or circuit boards are fabricated may include, for example, BT epoxy, glass fibers, copper, gold, polyimide, adhesive, overmold materials, underfills, conductors, dielectrics, stiffeners, stabilizers, protectors, semiconductor substrate, and metal conductor materials.

In an embodiment of the invention, a laser ablation method for cross-sectioning of an integrated circuit package is performed with images from other analytical tools such as Scanning Acoustic Microscopy (SAM), or X-ray computed tomography (CT) for navigation of optically invisible defects and structures. The accuracy of beam placement can be 25 microns or less. The method enables cross-sectioning of packages with multiple suspected defects and multiple die configurations. Two sets of process settings can be used for cross-sectioning: one for cutting through metal layers and semiconductor die and the other for cutting through other packaging materials. Exemplary process settings for cutting through metal layers are:

| | |
|---|---|
| Laser beam wavelength: | 1060 nanometers |
| Laser beam power density: | 318 Joules/cm2 |
| Pulse frequency: | 20 kHz |
| Pulse width: | 100 nanoseconds |
| Beam size: | 20 microns |
| Beam scan speed: | 0.5 meter/sec |
| Scan overlap: | 10 microns |
| Cut width: | 300 microns |

With these settings, it takes about 100 passes to cut an exemplary metal heat spreader which is 0.3 mm thick.

Exemplary process settings for cross sectioning of plastic package molding compound material are:

| | |
|---|---|
| Laser beam wavelength: | 1060 nanometers |
| Laser beam power density: | 240 Joules/cm2 |
| Pulse frequency: | 20 kHz |
| Pulse width: | 100 nanoseconds |
| Beam size: | 20 microns |
| Beam scan speed: | 0.5 meter/sec |
| Scan overlap: | 10 microns |
| Cut width: | 300 microns |

With these settings, it takes about 150 passes to cut an exemplary molding compound layer which is 1.4 mm thick.

The speed of material removal during cross sectioning can be increased by the selection of suitable cut width or kerf and the laser beam power. Ablation with wider kerfs takes more passes for each beam scan of the entire cross sectioning area. However, ablation with wider kerfs reduces the slowdown of the material removal due to geometrical factor as the transport of vaporized material from a narrow trench is slower. The geometrical effect is more significant for cross sectioning of thicker structure.

FIG. 9A is a SAM image of a Ball Grid Array (BGA) package 90 with a heat spreader 96. The dark area 91 indicates an area of fracture or delamination of encapsulation material above the die 92. FIG. 9B is an optical microscope image of an exemplary cross-section of the package 90 made with a laser ablation method of the invention along line f-f" of FIG. 9A. FIG. 9B shows all major structural elements before the exposed surface is polished, including the die 92, metal wires 93, heat spreader 94, encapsulation material 95, and the solder balls 96. The cross sectional image reveals a delamination area 91 in the encapsulation layer. FIG. 9C, is a schematic illustration of the cross-sectional view of the package 90 shown in FIG. 9B for clarification. Laser cross sectioning according to the invention includes, among other features, a navigation capability which is at times critical to determining the root causes of complex package failures as it enables precise cross sectioning of such packages, very close to the plane of interest. Benefits include reduced preparation time and more accurate positioning of the cross sectional cut relative to the location of interest.

The following is an exemplary overview of software for the system 1 which synchronizes a fiber optic laser, scanhead, digital camera with optical zoom system, lighting system, and an xy stage to perform decapsulation and cross-sectioning of semiconductors for failure analysis.

The Video Drawing Interface is part of the Graphical User Interface (GUI) 23, created for the ablation and cross sectioning processes. The video drawing module allows the user to draw, move, and resize a variety of shapes that are superimposed over incoming video frames. For the decapsulation process, the shapes may be shifted, rotated, and resized until the drawing area conforms to the desired area to be ablated. The cross-sectioning process requires the user to draw a line using the GUI that represents the cut line of the laser. The software application allows the user to input a set of parameters that control the cut width and cooling time. This allows the user to customize the cross-sectioning process based on the thickness and composition of the semiconductor device.

The shapes, once created, may then be stored on the hard drive of the computer system 25. The information stored includes the shape, size, laser settings, scanhead setting, and all optional user parameters as defined in the interface. The storage format allows for multiple settings to be saved for each ablation shape or cross-sectioning cut line. This allows the user to apply a different set of laser, scanhead, cut width, cooling, and other parameters to a single ablation shape or cross-sectioning cut line. This functionality is useful for conducting iterative passes over the same area to accomplish different degrees and types of ablation or cross-sectioning.

Once the operator has defined the ablation area or cross-sectioning cut line, the stage is moved under the scanhead. This mechanism is initiated when the user selects the appropriate control on the Graphical User Interface. This simple function allows the user to easily move the stage from POSITION A to POSITION B to alternate between the imaging and drawing phase, and the ablation or cross-sectioning phase.

An exemplary video overlay (SAM) interface allows the user to select and superimpose a pre-defined image of the internal wiring and components of the semiconductor device that is to be ablated or cross-sectioned over the video image of the actual semiconductor device that is placed on the stage.

The SAM overlay module first opens a schematic image from the hard drive of the FATcat. This image can then be re-sized, rotated, and shifted in order to superimpose it over the semiconductor device that is being imaged by the camera. The SAM module allows the user to adjust the alpha transparency level of the image through a simple parameter. This parameter directly controls the transparency level of the SAM image, allowing the user to adjust the visibility level of this image relative to the visibility of the imaged semiconductor.

The ability to use the SAM image increases the user's ability to accurately define the ablation area of cross-sectioning cut line. This is especially useful in the early iterations of the ablation process where the semiconductor is still encapsulated in the bonding material and visibility of the internal wiring is minimal or absent.

The laser and scanhead control are physically connected to the system 1 via a PCI card. The card has a digital output port which is connected to the laser and scanhead. The software allows the user define the required parameters for each device by using the Graphical User Interface. The required parameters for the laser include the laser power and frequency. The required parameters for the scanhead include the scanhead mode and scanhead delay.

Once the user has defined the ablation area or cross-sectioning cut line using the Video Drawing Interface of the GUI, the coordinates of the cut path are converted to scanhead parameters. Since the laser remains in a fixed position, the scanhead is used to effectuate the directional path or ablation area of the laser. To initiate the laser process, the stage must first be moved from POSITION A to POSITION B. Using the Graphical User Interface, the user initiates the laser process by selecting the activate option. The scanhead parameters are passed to the scanhead device in synchronization with the passing of the laser parameters to the laser device. The software controls both devices simultaneously to effectuate the defined ablation or cross-sectioning action. Once completed, the user may then return the stage to the POSITION A for re-imaging of the semiconductor device to determine if additional passes are required.

The Cleaning Pass routine is used to perform the detailed ablation of the plastic encapsulant during decapsulation of the semiconductor device. Due to the presence of air pockets and silica filler, ablation of the device is not entirely uniform. The result is faster removal of plastic molding in some regions, and slower removal in others. Continued iterative passes in the ablation process could damage the internal components of the device if the laser and scanhead were unable to be adjusted to factor in this phenomena.

The cleaning pass routine begins by grey-scaling a video image of the semiconductor device and presenting a Graphical User Interface for shading threshold selection. The user is able to adjust the threshold values for the area to be "passed over" by the laser with a set of slider controls that can be re-adjusted as the perceived lighting and reflectivity of the material changes with each ablative pass. The Cleaning Pass algorithm calculates the ablation area to be "passed over" by adding the microns-per pixel of the current camera zoom setting, the beam size, and a marginal safety factor. The camera image is then scanned from left to right. The areas selected that meet the criteria as defined through the slider controls are skipped during the ablation process.

The interface illustrates the areas that will be skipped (not lased) based on the currently selected threshold values. After the user is satisfied that the previously exposed areas will be skipped during the next ablative pass based on the visual image as presented, the user may move the stage from the viewing POSITION A to the lazing POSITION B. During ablation, when a block that should be skipped is encountered, the scanhead lazes the area up to that position, but terminates the laser until an area is reached that does not meet the criteria for being "passed over." This process is repeated for the entire shape as originally defined by the user.

While various embodiments of the present invention have been shown, such embodiments are provided by way of example only. Numerous variations, changes and substitutions may be made without departing from the invention which is only limited in scope by the claims which follow.

I claim:

1. A system for removing material from a packaged electronic device of the type encapsulated with a protective material that forms an outer surface of the device, comprising:
   a stage for placing the device in a first position for receiving laser radiation to remove the material by ablation, and for placing the device in a second position for viewing one or more features along the outer surface of the device;
   an optical system configured to provide an exterior image, including one or more features along an exposed surface of the device, while the device remains in the second position;
   a laser;
   a viewing system for (i) displaying a captured image of the device, including one or more features interior to the protective surface, overlayed with the exterior image for simultaneous viewing of both images so that a position of a first feature present in the captured image can be viewed in relation to a position of a second feature in the exterior image; and (ii) for using a combination of the first feature position and the second feature position to define a region of the device for material removal; and
   a scanning system, including electro-optical components, for directing a beam from the laser along an ablative scan path for removal of the material from the defined region.

2. The system of claim 1 wherein the viewing system includes a central focal axis orthogonal to a viewing plane along the second position of the stage, the system further including a lighting system providing illumination from a first source along the viewing plane at an angle, measurable along a direction of the focal axis, of 20 degrees or less.

3. The system of claim 2 wherein the lighting system illumination can reveal an opening, in the protective material that exposes an underlying material, having a maximum opening width of 25 microns or less, and a ratio of depth-to-width which requires illumination from an angle of 15 degrees or less, measured along a direction of the focal axis, in order to visually determine that the underlying material is exposed.

4. The system of claim 2 wherein illumination from the first source is variable and the lighting system also provides variable illumination from one or more second sources along the viewing plane at an angle, measurable along a direction of the focal axis, ranging between 15 degrees and 75 degrees, variability in illumination from the first and second sources enabling provision of variable contrast of features exposed for viewing in the external image during multiple stages of material removal.

5. The system of claim 4 wherein the one or more second sources are positioned closer to the stage than the first source.

6. The system of claim 4 wherein material removal is definable by an operator for automatic scanning along an exposed surface with removal only in select portions of the exposed surface based on differences in illumination levels among exposed features relative to a threshold value of illumination.

7. A method for removing material from a packaged electronic device of the type encapsulated with a protective material that forms an outer surface of the device, comprising:
provided a captured image of the device, the image including one or more features interior to the protective surface;
viewing one or more features along the outer surface of the device with an optical system while the device remains on a stage, said optical system providing an exterior image;
combining the captured image with the exterior image for simultaneous viewing so that the position of a first feature present in the captured image can be viewed in relation to the position of a second feature in the exterior image; and
defining a region in the device for decapsulation based on the position of the first feature relative to the position of the second feature.

8. The method of claim 7 further including the step of removing the protective material from the region by laser ablation.

9. A method of end point detection in a decapsulation process comprising the steps of:
performing a sequence of steps, including two or more laser ablation steps, on a packaged electronic device of the type encapsulated with a protective material that forms an outer surface of the device, in which material of a first layer is removed from a region of the device until a final exposed surface within the region extends to a sufficient depth below an upper exterior surface of the device, wherein the sequence exposes a second layer underlying the first layer, the sequence including
viewing intermediate exposed surfaces between laser ablation steps with an optical system including a central focal axis orthogonal to a viewing plane along one of the intermediate exposed surfaces, said viewing performed with illumination from a first source along the viewing plane at an angle, measurable along a direction of the focal axis, of 20 degrees or less.

10. The method of claim 9 wherein the viewing enables detection of an opening in the first layer that exposes a portion of the second layer.

11. The method of claim 10 wherein, when the opening has a maximum opening width of 25 microns or less, the illumination is provided from an angle of 15 degrees or less, measured along a direction of the focal axis, in order to visually determine that the underlying material is exposed.

12. The method of claim 11 further including modifying process settings for a laser ablation performed after detecting the opening.

13. The method of claim 9 wherein the viewing is performed with illumination at an angle that enables detection of an opening in the first layer that exposes a portion of the second layer when the opening has a maximum opening width of 25 microns or less.

14. A method of removing material in a decapsulation process comprising performing a sequence of steps, including two or more laser ablation steps performed along scan paths, on a packaged electronic device of the type encapsulated with a protective material that forms an outer surface of the device, in which material of a first layer is removed from a region of the device until a final exposed surface within the region extends to a sufficient depth below an upper exterior surface of the device, wherein the sequence exposes a second layer underlying the first layer, the sequence including viewing intermediate exposed surfaces between laser ablation steps with an optical system including a central focal axis orthogonal to a viewing plane along one of the intermediate exposed surfaces, said viewing performed with a lighting system providing illumination from a first source along the viewing plane positioned at an angle, measurable along a direction of the focal axis, of 20 degrees or less and said lighting system providing illumination, from one or more second sources, along the viewing plane at an angle, measurable along a direction of the focal axis, ranging between 15 degrees and 75 degrees, variability in illumination from the first and second sources enabling provision of variable contrast of features exposed for viewing in the external image during multiple stages of material removal.

15. The method of claim 14 including modifying parameters or the scan path of an ablation step responsive to viewing of an intermediate exposed surface to only remove material according to a threshold illumination criterion.

16. The method of claim 14 including varying illumination from the first source and from one or more second sources to adjust the contrast of features.

17. A method for preparing a packaged electronic device, of the type encapsulated with a protective material that forms an outer surface of the device, for analysis, comprising:
providing a captured image of the device, the image including one or more features interior to the protective surface;
viewing one or more features along the outer surface of the device with an optical system while the device remains in a reference frame, said optical system providing an exterior image;
combining the captured image with the exterior image for simultaneous viewing so that the position of a first feature present in the captured image can be viewed in relation to the position of a second feature in the exterior image; and
defining a cut line along the outer surface for sectioning the device based on the position of the first feature relative to the position of the second feature.

18. The method of claim 17 further including the step of sectioning the device with a scanning laser.

19. The method of claim 17 further including the step of removing material along the cut line by passing an ablating laser beam along the cut line with overlapping scans.

20. A method of decapsulating a semiconductor device to expose a die surface therein, comprising:
a bulk decapsulation step exposing the encapsulation material to a continuous multi-pass scanning pulsed laser beam wherein the bulk decapsulation step removes a portion of an encapsulation layer in a predefined region;
a selected area decapsulation step performed after the bulk decapsulation step, exposing encapsulation material in the region to a single pass scanning laser beam pattern wherein the pattern excludes selected areas from the beam scan to expose a portion of the die surface; and
a clean-up decapsulation step, exposing encapsulation material, remaining in the region after the portion of the die surface becomes exposed, to one or more additional single-pass scanning laser beam patterns different from the beam pattern of the selected area decapsulation step, wherein the clean-up step removes a further portion of the encapsulation layer to further expose the die surface, and laser settings for the clean-up decapsulation step are adjusted relative to the selected area decapsulation step.

21. The method of claim 20 wherein the laser settings for the clean-up decapsulation step are adjusted to avoid thermal damage to the die surface and the bulk decapsulation step is performed in a decapsulation chamber with a laser wavelength ranging from about 530 nm to 1200 nm.

22. The method of claim 21, wherein the bulk decapsulation step is performed with a laser beam energy density of about 10 joules/cm2 to 500 joules/cm2.

23. The method of claim 21, wherein the bulk decapsulation step is performed with a laser pulse frequency of about 5 KHz to 50 KHz.

24. The method of claim 21, wherein the bulk decapsulation step is performed with a laser pulse width of less than 500 nanoseconds.

25. The method of claim 21, wherein the bulk decapsulation step is performed with a laser beam size of less than 100 microns.

26. The method of claim 21, wherein the bulk decapsulation step is performed with a beam scan speed of more than 0.1 meter/second.

27. The method of claim 21, wherein the bulk decapsulation step is performed with a beam scan overlap of less than 50 microns.

28. The method of claim 20, wherein the selected area decapsulation step is performed in a decapsulation chamber with a laser wavelength of about 530 nm to 1200 nm.

29. The method of claim 20, wherein said excluded areas include exposed metal wires and areas sensitive to laser beam exposure.

* * * * *